United States Patent
Kinpara et al.

(10) Patent No.: US 12,360,260 B2
(45) Date of Patent: Jul. 15, 2025

(54) RADIATION DETECTOR, DETECTOR MODULE, AND RADIATION DETECTOR PRODUCTION METHOD

(71) Applicant: HAMAMATSU PHOTONICS K.K., Hamamatsu (JP)

(72) Inventors: Masanori Kinpara, Hamamatsu (JP); Osamu Nakane, Hamamatsu (JP); Ryotaro Ishikawa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 219 days.

(21) Appl. No.: 18/035,158

(22) PCT Filed: Oct. 8, 2021

(86) PCT No.: PCT/JP2021/037365
§ 371 (c)(1),
(2) Date: May 3, 2023

(87) PCT Pub. No.: WO2022/130748
PCT Pub. Date: Jun. 23, 2022

(65) Prior Publication Data
US 2023/0400594 A1  Dec. 14, 2023

(30) Foreign Application Priority Data

Dec. 14, 2020  (JP) ................. 2020-206683

(51) Int. Cl.
*G01T 1/24*  (2006.01)
(52) U.S. Cl.
CPC .............. *G01T 1/241* (2013.01); *G01T 1/243* (2013.01)
(58) Field of Classification Search
CPC ...................................... G01T 1/241
See application file for complete search history.

(56) References Cited

U.S. PATENT DOCUMENTS 10,782,427 B2 * 9/2020 Kinpara ............. G01T 1/241
2008/0185609 A1  8/2008 Kozawa et al.
(Continued)

FOREIGN PATENT DOCUMENTS

JP  2009-156800 A   7/2009
JP  5083964 B2    11/2012
(Continued)

OTHER PUBLICATIONS

International Preliminary Report on Patentability mailed Jun. 29, 2023 for PCT/JP2021/037365.

*Primary Examiner* — David P Porta
*Assistant Examiner* — Shun Lee
(74) *Attorney, Agent, or Firm* — Faegre Drinker Biddle & Reath LLP

(57) ABSTRACT

The present disclosure relates to a radiation detector that is capable of preventing deterioration in an SN ratio of a read-out signal. The radiation detector includes a TlBr crystalline body, and a first electrode and a second electrode that have been provided on respective electrode formation surfaces. At least one of the first electrode and the second electrode includes a first layer and a second layer. The first layer formed on the electrode formation surface contains metallic thallium, or a first alloy of metallic thallium and another metal. The second layer on the first layer contains an alloy of a first metal and a second metal. A diffusion coefficient of metallic thallium to a layer comprised of the alloy of the first metal and the second metal is smaller than a diffusion coefficient of metallic thallium to a layer comprised of the second metal.

26 Claims, 19 Drawing Sheets

(56) References Cited

U.S. PATENT DOCUMENTS

2013/0026364 A1    1/2013   Conway et al.
2016/0282485 A1    9/2016   Takahashi et al.
2019/0346576 A1   11/2019   Kinpara et al.

FOREIGN PATENT DOCUMENTS

| JP | 2015-102340 A | 6/2015 |
| JP | 2016-149443 A | 8/2016 |
| JP | 6242954 B1 | 12/2017 |
| JP | 2018-009801 A | 1/2018 |
| TW | 200802697 A | 1/2008 |

* cited by examiner

RADIATION DETECTOR, DETECTOR MODULE, AND RADIATION DETECTOR PRODUCTION METHOD

TECHNICAL FIELD

The present invention relates to a radiation detector, a detector module, and a radiation detector production method.

The present application claims the benefit of priority of Japanese Patent Application No. 2020-206683, filed on Dec. 14, 2020, and is based upon the content of the application, the entire content of which is incorporated herein by reference.

BACKGROUND ART

A radiation detector is a device that detects radiation such as X-rays or gamma rays, and can be used in a positron emission tomography (PET) device, a single photon emission computed tomography (SPECT) device, a gamma camera, a Compton camera, an imaging spectrometer, and the like.

As the radiation detector, a configuration using a thallium halide crystal (for example, thallium bromide, thallium iodide, thallium chloride, and a mixed crystal thereof) is known. As an example, Patent Document 1 and Patent Document 2 disclose a radiation detector having a parallel plate-shaped configuration in which a thallium bromide (TlBr) crystalline body is provided between a first electrode and a second electrode. One of the first electrode and the second electrode is used as an anode electrode, and another is used as a cathode electrode. A radiation detector using a TlBr crystal is advantageous in that this can be produced easily at a low cost and has high sensitivity. Note that, in some cases, one or more electrodes are further provided between the first electrode and the second electrode in order to control electrolysis or electrostatically shield an electric field.

The radiation detector described in Patent Document 1 uses, as electrodes, metallic thallium electrodes that are only comprised of thallium (Tl) metal. By using the metallic thallium electrodes, polarization of the TlBr crystal can be prevented, and it has been considered that a long-term stable operation of the radiation detector is possible.

If the metallic thallium electrodes are used as the electrodes of the radiation detector, the metallic thallium electrodes rapidly corrode in the atmosphere and deteriorate, and characteristics of the radiation detector deteriorate. This also occurs in a case where a metal layer of, for example, gold has been formed on the metallic thallium electrodes by performing vapor deposition. In order to prevent this deterioration, it is necessary to improve moisture resistance by sealing the metallic thallium electrodes with resin or the like after making the radiation detector, and to avoid oxidation or reaction with the air atmosphere.

However, for example, in a case where the radiation detector is mounted as a two-dimensional detector on a readout circuit board, electrical conduction between the electrode of the radiation detector and an electrode pad of the readout circuit board fails to be obtained due to sealing with resin. This hinders practical application of the radiation detector using the TlBr crystal.

An invention that can solve such problems is disclosed in Patent Document 2. An electrode of the radiation detector disclosed in this document includes an alloy layer of metallic thallium and another metal (for example, lead, silver, bismuth, or indium), and also includes a low-resistance metal layer (for example, gold) that is provided on this alloy layer. The electrode includes a thallium alloy layer, and therefore a deterioration in characteristics of the detector due to polarization of the TlBr crystal can be prevented, and the corrosion of the electrode in the atmosphere can also be prevented.

CITATION LIST

Patent Literature

Patent Document 1: Japanese Patent No. 5083964
Patent Document 2: Japanese Patent No. 6242954

SUMMARY OF INVENTION

Technical Problem

As a result of examination of the conventional technologies described above, the inventors have discovered the problem described below. Stated another way, the present inventors have found out that the radiation detector disclosed in Patent Document 2 described above has the following problem. In the radiation detector disclosed in Patent Document 2 described above, when the electrode of the radiation detector and the electrode pad of the readout circuit board were electrically connected by using a conductive adhesive, and a signal was read out from the radiation detector to the readout circuit bard, the read-out signal had a low SN ratio in some cases. Both the thallium alloy layer and the low-resistance metal layer that form the electrode have a sufficiently low resistance value, and therefore it has been considered that the cause of a deterioration in the SN ratio of the read-out signal is present on a surface of the low-resistance metal layer or in a region near the surface. Accordingly, the present inventors have clarified the cause of a deterioration in the SN ratio of the read-out signal, by analyzing the surface of the low-resistance metal layer or the region near the surface by using X-rays, have conducted intensive studies in order to eliminate the cause, and have conceived of the present invention.

The present invention has been made to solve the problems described above, and it is an object of the present invention to provide a radiation detector, a detector module, and a radiation detector production method that are capable of preventing a deterioration in an SN ratio of a signal to be read out.

Solution to Problem

A radiation detector according to the present embodiment includes a thallium bromide crystalline body, and a first electrode and the second electrode respectively provided on electrode formation surfaces set in different positions of the thallium bromide crystalline body. At least one electrode of the first electrode and the second electrode includes a first layer and a second layer. The first layer is the first layer provided on a corresponding electrode formation surface of the electrode formation surfaces, and contains metallic thallium, or a first alloy of the metallic thallium and a metal different from the metallic thallium. Furthermore, the second layer is a layer provided on the first layer, and contains a second alloy of a first metal and a second metal. The first metal and the second metal are selected, in particular, to cause a diffusion coefficient of the metallic thallium with respect to a layer comprised of the second alloy to be smaller than the diffusion coefficient of the metallic thallium with respect to a layer comprised of the second metal.

Advantageous Effects of Invention

According to the present invention, a radiation detector or the like that is capable of preventing a deterioration in an SN ratio of a signal to be read out is obtained.

DESCRIPTION OF EMBODIMENTS

Figure 1:
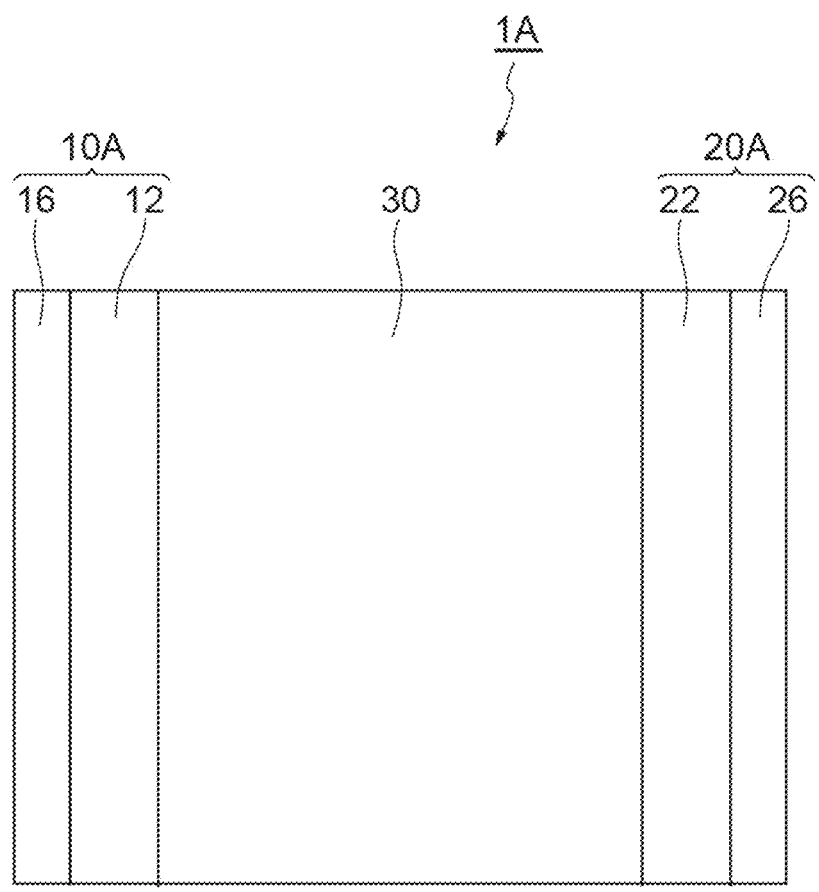
FIG. 1 is a diagram illustrating a cross-sectional configuration of a radiation detector 1A according to a first embodiment.

Description of Embodiments of the Invention of the Present Application

First, the content of each embodiment of the invention of the present application is individually listed and described.

(1) In one aspect, a radiation detector according to the present embodiment includes a thallium bromide crystalline body, and a first electrode and the second electrode respectively provided on electrode formation surfaces set in different positions of the thallium bromide crystalline body. At least one electrode of the first electrode and the second electrode includes a first layer and a second layer. The first layer is the first layer provided on a corresponding electrode formation surface of the electrode formation surfaces, and contains metallic thallium, or a first alloy of the metallic thallium and a metal different from the metallic thallium. Furthermore, the second layer is a layer provided on the first layer, and contains a second alloy of a first metal and a second metal. The first metal and the second metal are selected, in particular, to cause a diffusion coefficient of the metallic thallium with respect to a layer comprised of the second alloy (a diffusion coefficient of the metallic thallium when the metallic thallium diffuses in the layer comprised of the second alloy) to be smaller than the diffusion coefficient of the metallic thallium with respect to a layer comprised of the second metal (the diffusion coefficient of the metallic thallium when the metallic thallium diffuses in the layer comprised of the second metal).

Note that another electrode of the first electrode and the second electrode may be constituted by a layer of only a low-resistance metal such as gold or platinum. Furthermore, even in a case where the other electrode includes the first layer and the second layer that have been described above, the first electrode and the second electrode may employ electrode structures different from each other.

(2) In one aspect of the present embodiment, the first layer may include a thallium layer containing the metallic thallium or the first alloy, and a first metal layer provided on the thallium layer. This first metal layer contains the first metal. Furthermore, in one aspect of the present embodiment, the first layer may contain an alloy of the metallic thallium and the first metal as the first alloy. In one aspect of the present embodiment, the first layer may contain the alloy of the metallic thallium and the first metal as the first alloy, and may contain the first metal in excess. In one aspect of the present embodiment, the first layer may contain, as the first alloy, an alloy of the metallic thallium and any one or more metals of lead, silver, bismuth, and indium. In one aspect of the present embodiment, it is preferable that the first metal be any metal of bismuth, lead, tin, and antimony. In one aspect of the present embodiment, it is preferable that the second metal be any of gold and platinum.

(3) In one aspect of the present embodiment, the radiation detector may further include an intermediate layer provided between the first layer and the second layer, the intermediate layer being conductive, and enhancing adhesive force between the first layer and the second layer. In one aspect of the present embodiment, the intermediate layer may contain any metal of chromium, nickel, and titanium.

(4) In one aspect of the present embodiment, the radiation detector may further include a conductive under layer provided between an electrode formation surface corresponding to any electrode and the first layer, the conductive under layer enhancing adhesive force between the corresponding electrode formation surface and the first layer. In one aspect of the present embodiment, the under layer may contain any metal of chromium, nickel, and titanium.

(5) A detector module according to the present embodiment includes a radiation detector having the structure described above, and a readout circuit board. The readout circuit board is a readout circuit board that is electrically connected to the first electrode or the second electrode of the radiation detector. Furthermore, this readout circuit board is provided with a circuit that receives, as an input, a signal outputted from the radiation detector in response to detection of radiation, and processes the signal. Furthermore, in one aspect of the present embodiment, the first electrode or the second electrode of the radiation detector may be mutually electrically connected to an electrode pad on the readout circuit board by using a conductive adhesive. In one aspect of the present embodiment, it is preferable that a space between the radiation detector and the readout circuit board be filled with resin. In one aspect of the present embodiment, it is preferable that the radiation detector on the readout circuit board be covered with resin.

(6) In one aspect, a radiation detector production method according to the present embodiment includes a first process for preparing a thallium bromide crystalline body, and a second process for respectively forming a first electrode and the second electrode on electrode formation surfaces set in different positions of the thallium bromide crystalline body. The second process includes a first layer forming process and a second layer forming process as a process for forming at least one electrode of the first electrode and the second electrode. In the first layer forming process, a first layer that is provided on an electrode formation surface that corresponds to any electrode from among the electrode formation surfaces. This first layer contains metallic thallium, or a first alloy of the metallic thallium and a metal different from the metallic thallium. In the second layer forming process, a second layer is formed on the first layer. This second layer contains a second alloy of a first metal and a second metal. The first metal and the second metal are selected, in particular, to cause a diffusion coefficient of the metallic thallium with respect to a layer comprised of the second alloy to be smaller than the diffusion coefficient of the metallic thallium with respect to a layer comprised of the second metal.

(7) In one aspect of the present embodiment, in the first layer forming process, the first layer may be formed by forming a thallium layer containing the metallic thallium or the first alloy, and stacking a first metal layer containing the first metal on the thallium layer. In the second layer forming process, the second layer containing an alloy of the second metal and the first metal diffused from the first layer may be formed by forming an upper layer comprised of the second metal on the first layer, and then heating a laminated body constituted by the first layer and the upper layer. In one aspect of the present embodiment, in the first layer forming process, the first layer containing an alloy of the metallic thallium and the first metal as the first alloy may be formed. In the second layer forming process, the second layer containing an alloy of the second layer and the first metal diffused from the first layer may be formed by forming an upper layer comprised of the second metal on the first layer, and then heating a laminated body constituted by the first layer and the upper layer. In one aspect of the present embodiment, in the first layer forming process, the first layer containing the alloy of the metallic thallium and the first metal as the first alloy and containing the first metal in excess may be formed. In one aspect of the present embodiment, in the first layer forming process, the first layer containing, as the first alloy, an alloy of the metallic thallium and any one or more metals of lead, silver, bismuth, and indium may be formed.

(8) In one aspect of the present embodiment, the first metal may be any metal of bismuth, lead, tin, and antimony. Furthermore, in one aspect of the present embodiment, the second metal may be any metal of gold and platinum.

(9) In one aspect of the present embodiment, the radiation detector production method may further include an intermediate layer forming process for forming an intermediate layer that is conductive and enhances adhesive force between the first layer and the second layer, after the first layer forming process and before the second layer forming process. In one aspect of the present embodiment, the intermediate layer may contain any metal of chromium, nickel, and titanium.

(10) In one aspect of the present embodiment, the radiation detector production method may further include an under layer forming process for forming a conductive under layer provided between a corresponding electrode formation surface and the first layer, the conductive under layer enhancing adhesive force between the corresponding electrode formation surface and the first layer, before the first layer forming process. In one aspect of the present embodiment, it is preferable that the conductive under layer contain any metal of chromium, nickel, and titanium.

Each of the aspects listed above in the section [Description of Embodiments of the Invention of the Present Application] can be applied to each of all the remaining aspects or all the combinations of the remaining aspects.

Details of Embodiments of the Invention of the Present Application

Specific structures of the radiation detector, the detector module, and the radiation detector production method according to the present embodiments are described in detail below with reference to the attached drawings. Note that the present invention is not limited to these illustrative examples, but is recited in the claims, and it is intended that equivalents of the claims and all the modifications within the scope are included. Furthermore, in the description of the drawings, the same reference sign is assigned to the same elements, and a duplicate description is omitted.

Note that, in each of the radiation detectors 1A to 1F illustrated in FIGS. 1, 2, and 4 to 7 that are described below, a first electrode and a second electrode that are provided on a thallium bromide (TlBr) crystalline body have the same electrode structure, but electrode structures different from each other may be employed in these first and second electrodes. Stated another way, any of the first electrodes 10A to 1° F. described later can be applied to the first electrode irrespective of an electrode structure of the second electrode. Any of the second electrodes 20A to 20F described later can be applied to the second electrode irrespective of an electrode structure of the first electrode. Furthermore, either the first electrode or the second electrode may have an electrode structure that is different from the structures illustrated in FIGS. 1, 2, and 4 to 7 (for example, it is constituted by a layer of only a low-resistance metal such as gold or platinum).

First Embodiment

FIG. 1 is a diagram illustrating a cross-sectional configuration of a radiation detector 1A according to a first embodiment. The radiation detector 1A has a flat plate shape in which the first electrode 10A and the second electrode 20A have been provided on a thallium bromide (TlBr) crystalline body 30. The first electrode 10A has been formed on one surface (a first electrode formation surface) of two surfaces parallel to each other of the TlBr crystalline body 30, for example, by performing vapor deposition, and the second electrode 20A has been formed on another surface (a second electrode formation surface), for example, by performing vapor deposition.

The first electrode 10A includes a first layer 12 and a second layer 16. The first layer 12 formed on the first electrode formation surface of the TlBr crystalline body 30 contains metallic thallium or a thallium alloy (a first alloy). The second layer 16 formed on the first layer 12 contains an alloy of a first metal and a second metal (a second alloy). The second layer 16 is lower in resistance than the first layer 12.

The second electrode 20A includes a first layer 22 and a second layer 26. The first layer 22 formed on the second electrode formation surface of the TlBr crystalline body 30 contains metallic thallium or a thallium alloy. The second layer 26 formed on the first layer 22 contains the alloy of the first metal and the second metal. The second layer 26 is lower in resistance than the first layer 22.

Thicknesses of the first layers 12 and 22 are, for example, several tens of nm to several hundreds of nm. In a case where the first layers 12 and 22 contain the thallium alloy (a Tl alloy), the Tl alloy is an alloy of metallic thallium (metallic Tl) and another metal. Another metallic element forming the Tl alloy together with metallic Tl may be arbitrary, but preferably, one or more elements selected from lead (Pb), silver (Ag), bismuth (Bi), and indium (In) are used.

The Tl alloy is, for example, Tl—Pb, Tl—Ag, Tl—Bi, Tl—In, Tl—Pb—Bi, Tl—Pb—In, or the like. The Tl alloy contains Tl as metal, but does not contain Tl only as a compound (for example, Tl oxide, Tl fluoride, Tl nitrate, or the like). A content ratio of metallic Tl in the Tl alloy is at a level at which metallic Tl is detected in analysis using X-ray fluorescence (XRF) spectroscopy. Note that a surface of a Tl alloy layer is oxidized due to contact with air in some cases, but the inside of the Tl alloy layer is not oxidized.

One of the first electrode 10A and the second electrode 20A is used as an anode electrode, and another is used as a cathode electrode. A halogenated thallium crystal has ion conductivity, and therefore if voltage is applied to the TlBr crystalline body 30, $Tl^+$ ions accumulate under the cathode electrode, and $Br^-$ ions accumulate under the anode electrode. The radiation detector 1A can detect radiation incidence, by using a current flowing between both the electrodes according to a movement of an electron-hole pair generated by the incident radiation due to the applied voltage.

The $Br^-$ ions that have accumulated under the anode electrode combine with metallic Tl contained in the anode electrode, TlBr is generated, and at this time, electrons are emitted. The $Tl^+$ ions that have accumulated under the cathode electrode combine with the emitted electrons, and metallic Tl is generated. Metallic Tl and TlBr generated in these reactions are not ions, and they have no charge. Therefore, polarization of the TlBr crystalline body 30 can be prevented.

Thicknesses of the second layers 16 and 26 are, for example, several tens of nm to several hundreds of nm. The first metal forming the alloys of the second layers 16 and 26 is preferably any of bismuth (Bi), lead (Pb), tin (Sn), and antimony (Sb), and the second metal is preferably any of gold (Au) and platinum (Pt). In the second layers 16 and 26, the second metal and the alloy of the first metal and the second metal may be mixed, or a layer of the second metal and a layer of the alloy of the first metal and the second metal may be stacked. In the second layers 16 and 26, the layer of the alloy of the first metal and the second metal may be formed on the layer of the second metal, may be formed under the layer of the second metal, or may be formed to be sandwiched between the layers of the second metal.

A diffusion coefficient of metallic Tl with respect to the layer of the alloy of the first metal and the second metal in the second layers 16 and 26 is smaller than a diffusion coefficient of metallic Tl with respect to the layer of the second metal. As a result of this, even if metallic Tl that has been present in the first layers 12 and 22 immediately after making has diffused with the lapse of time, the layer of the alloy of the first metal and the second metal in the second layers 16 and 26 prevents the diffusion of metallic Tl, and deposition of metallic Tl on surfaces of the second layers 16 and 26 is prevented.

If metallic Tl has been deposited on the surfaces of the second layers 16 and 26, the deposited metallic Tl is oxidized, and thallium oxide ($TlO_2$) is generated. The thallium oxide reacts with moisture in the atmosphere, and strongly basic thallium hydroxide (TlOH) having high corrosiveness is generated. This is a factor of a deterioration in an SN ratio of a signal to be read out.

However, in the radiation detector 1A according to the present embodiment, deposition of metallic Tl on the surfaces of the second layers 16 and 26 is prevented, and corrosion of the first electrode 10A and the second electrode 20A is prevented. Therefore, a deterioration in the SN ratio of the signal to be read out can be prevented.

Figure 2:
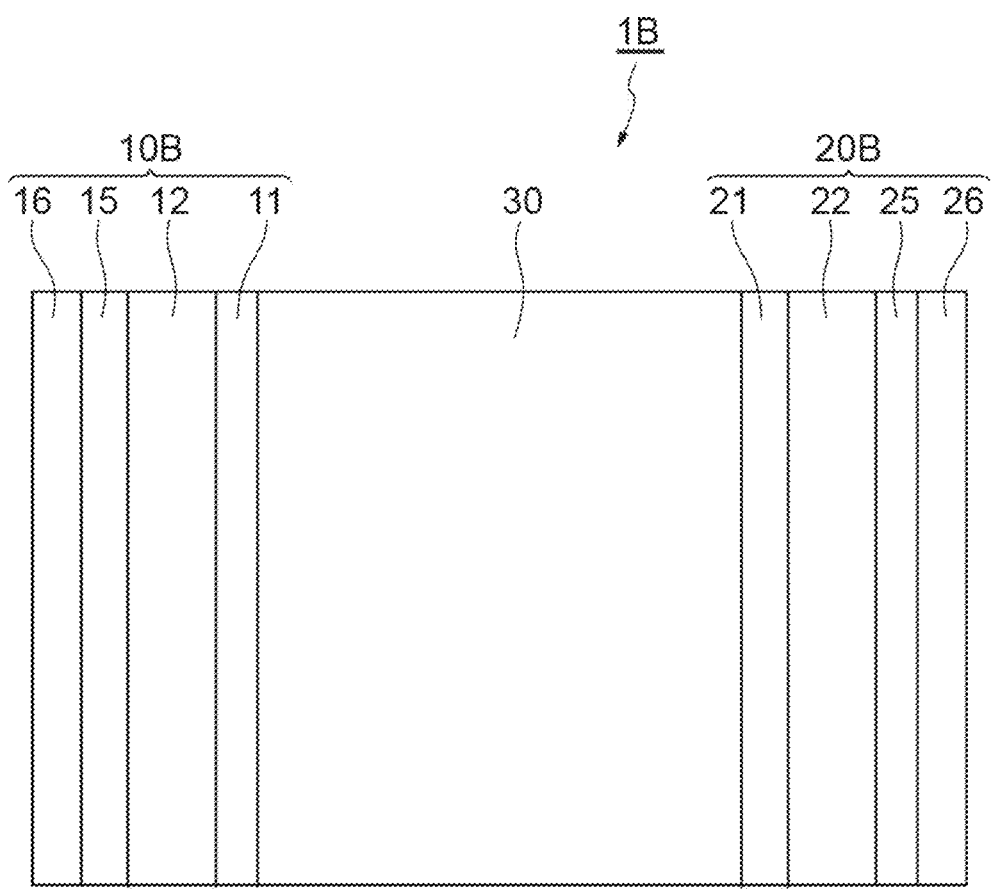
FIG. 2 is a diagram illustrating a cross-sectional configuration of a radiation detector 1B in a variation of the first embodiment.

FIG. 2 is a diagram illustrating a cross-sectional configuration of a radiation detector 1B in a variation of the first embodiment. The radiation detector 1B has a flat-plate shaped structure in which a first electrode 10B and a second electrode 20B have been provided on the thallium bromide (TlBr) crystalline body 30. The first electrode 10B has been formed on one surface (the first electrode formation surface) of two surfaces parallel to each other of the TlBr crystalline body 30, for example, by performing vapor deposition, and the second electrode 20B has been formed on another surface (the second electrode formation surface), for example, by performing vapor deposition.

The first electrode 10B includes an under layer 11, the first layer 12, an intermediate layer 15, and the second layer 16. The second electrode 20B includes an under layer 21, the first layer 22, an intermediate layer 25, and the second layer 26. In comparison with a configuration of the radiation detector 1A (FIG. 1), a configuration of the radiation detector 1B (FIG. 2) is different in that the first electrode 10B further includes the under layer 11 and the intermediate layer 15, and the second electrode 20B further includes the under layer 21 and the intermediate layer 25.

The under layer 11 is inserted in order to enhance adhesive force between the first electrode formation surface of the TlBr crystalline body 30 and the first layer 12. The under layer 21 is inserted in order to enhance adhesive force between the second electrode formation surface of the TlBr crystalline body 30 and the first layer 22. The under layers 11 and 21 have conductivity. The under layers 11 and 21 are thin films having an island-shaped structure, and thicknesses of the under layers 11 and 21 are, for example, several nm to several tens of nm. A material of the under layers 11 and 21 may be arbitrary, but is preferably comprised of any metal of chromium (Cr), nickel (Ni), and titanium (Ti).

The intermediate layer 15 is inserted in order to enhance adhesive force between the first layer 12 and the second layer 16. The intermediate layer 25 is inserted in order to enhance adhesive force between the first layer 22 and the second layer 26. The intermediate layers 15 and 25 have conductivity. Thicknesses of the intermediate layers 15 and 25 are, for example, several nm to several hundreds of nm. A material of the intermediate layers 15 and 25 may be arbitrary, but is preferably comprised of any metal of chromium (Cr), nickel (Ni), and titanium (Ti).

The radiation detector 1B (FIG. 2) exhibits functional effects that are similar to functional effects of the radiation detector 1A (FIG. 1). In addition, the under layers 11 and 21 and the intermediate layers 15 and 25 have been provided, and therefore a film structure of each of the first electrode 10B and the second electrode 20B is stabler.

Figure 3:
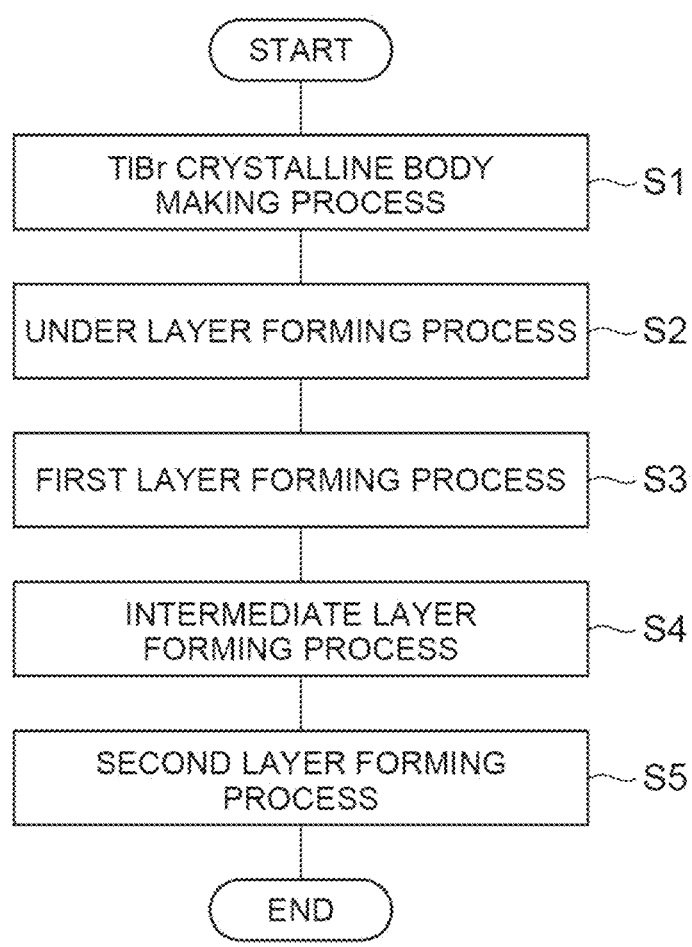
FIG. 3 is a flowchart explaining a radiation detector production method.

Next, an example of a method for producing the radiation detector 1B (FIG. 2) is described. FIG. 3 is a flowchart explaining a radiation detector production method. This radiation detector production method includes a TlBr crystalline body making process S1, an under layer forming process S2, a first layer forming process S3, an intermediate layer forming process S4, and a second layer forming process S5, and the radiation detector 1B (FIG. 2) can be produced by sequentially performing these processes.

In the TlBr crystalline body making process S1, the TlBr crystalline body 30 obtained by cutting a wafer of a TlBr crystal into an appropriate size (for example, a rectangle having a side length of approximately 10 mm to 20 mm) is prepared, and a surface of this TlBr crystalline body 30 is polished. The wafer may be cut after the wafer has been polished. Furthermore, the TlBr crystalline body 30 is degreased and washed.

In the under layer forming process S2, the under layer 11 is formed thinly on the polished surface (the first electrode formation surface) of the TlBr crystalline body 30 by performing vapor deposition, by using any metal of Cr, Ni, and Ti as an evaporation source. By providing the under layer 11, adhesive force between the first electrode formation surface of the TlBr crystalline body 30 and the first layer 12 can be enhanced.

In the first layer forming process S3, the first layer 12 containing metallic Tl or a Tl alloy is formed on the under layer 11 by performing vapor deposition. In a case where the first layer 12 containing the Tl alloy is formed, metallic Tl and another metal are put in advance as raw materials in a tungsten boat or an alumina crucible at an appropriate weight ratio, and are heated in a vacuum chamber in which pressure has been reduced to $10^{-3}$ Pa or lower. As a result of this, metallic Tl and the other metal are alloyed. Then, the first layer 12 is formed on the under layer 11 by performing vapor deposition, by using this alloy as an evaporation source. Adhesive force or electrical stability of the first layer 12 can be improved by heating the TlBr crystalline body 30 in a stage before or after the first layer 12 is vapor-deposited or during vapor deposition.

In the intermediate layer forming process S4, after the TlBr crystalline body 30 after formation up to the first layer 12 has been cooled down, the intermediate layer 15 is formed thinly on the first layer 12 by performing vapor deposition, by using any metal of Cr, Ni, and Ti as an evaporation source. By providing the intermediate layer 15, adhesive force between the first layer 12 and the second layer 16 can be enhanced.

In the second layer forming process S5, the second layer 16 is formed on the intermediate layer 15 by performing vapor deposition, by using, as an evaporation source, the alloy of the first metal and the second metal that has been prepared in advance. Alternatively, the second layer 16 may be formed by stacking the layer of the first metal and the layer of the alloy of the first metal and the second metal on the intermediate layer 15 by performing vapor deposition.

By performing the above, the first electrode 10B is formed on one surface (the first electrode formation surface) of the TlBr crystalline body 30. After the TlBr crystalline body 30 in which the first electrode 10B has been formed has been sufficiently cooled down, the under layer 21, the first layer 22, the intermediate layer 25, and the second layer 26 are sequentially formed in a similar manner on another polished surface (the second electrode formation surface) of the TlBr crystalline body 30 that is opposite to the surface on which the first electrode 10B has been formed, and the second electrode 20B is formed. By performing the above, the radiation detector 1B (FIG. 2) can be produced.

Second Embodiment

Figure 4:
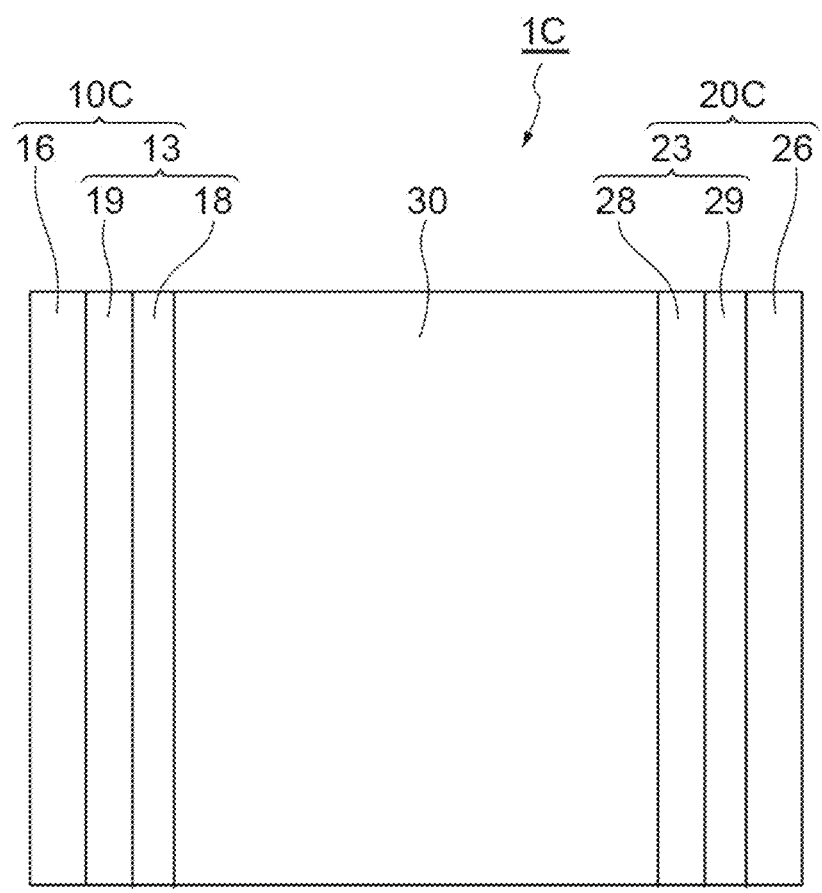
FIG. 4 is a diagram illustrating a cross-sectional configuration of a radiation detector 1C according to a second embodiment.

FIG. 4 is a diagram illustrating a cross-sectional configuration of a radiation detector 1C according to a second embodiment. The radiation detector 1C has a flat-plate shaped structure in which a first electrode 10C and a second electrode 20C have been provided on the thallium bromide (TlBr) crystalline body 30. The first electrode 10C has been formed on one surface (the first electrode formation surface) of two surfaces parallel to each other of the TlBr crystalline body 30, for example, by performing vapor deposition, and the second electrode 20C has been formed on another surface (the second electrode formation surface), for example, by performing vapor deposition.

The first electrode 10C includes a first layer 13 and the second layer 16. In the first layer 13 that has been formed on the first electrode formation surface of the TlBr crystalline body 30, a thallium layer 18 containing metallic thallium or the thallium alloy (the first alloy), and a first metal layer 19 containing the first metal on this thallium layer 18 have been stacked. The second layer 16 formed on the first layer 13 contains the alloy of the first metal and the second metal (the second alloy). The second layer 16 is lower in resistance than the first layer 13.

The second electrode 20C includes a first layer 23 and the second layer 26. In the first layer 23 that has been formed on the second electrode formation surface of the TlBr crystalline body 30, a thallium layer 28 containing metallic thallium or the thallium alloy, and a first metal layer 29 containing the first metal on this thallium layer 28 have been stacked. The second layer 26 formed on the first layer 23 contains the alloy of the first metal and the second metal. The second layer 26 is lower in resistance than the first layer 23.

In comparison with the configuration of the radiation detector 1A (FIG. 1), a configuration of the radiation detector 1C (FIG. 4) is different in that the thallium layer 18 and the first metal layer 19 have been stacked in the first layer 13 of the first electrode 10C, and is different in that the thallium layer 28 and the first metal layer 29 have been stacked in the first layer 23 of the second electrode 20C.

Thicknesses of the thallium layers 18 and 28 and the first metal layers 19 and 29 are, for example, several tens of nm to several hundreds of nm. The thallium layers 18 and 28 correspond to the first layers 12 and 22 in the configuration of the radiation detector 1A (FIG. 1). The first metal contained in the first metal layers 19 and 29 is the same as the first metal described in the first embodiment. The second layers 16 and 26 in the configuration of the radiation detector 1C (FIG. 4) correspond to the second layers 16 and 26 in the configuration of the radiation detector 1A (FIG. 1).

In the radiation detector 1C, similarly, a diffusion coefficient of metallic Tl with respect to a layer of the alloy of the first metal and the second metal in the second layers 16 and 26 is smaller than a diffusion coefficient of metallic Tl with respect to a layer of the second metal. As a result of this, even if metallic Tl that has been present in the first layers 13 and 23 immediately after making has diffused with the lapse of time, the layer of the alloy of the first metal and the second metal in the second layers 16 and 26 prevents the diffusion of metallic Tl, and deposition of metallic Tl on surfaces of the second layers 16 and 26 is prevented. Then, corrosion of the first electrode 10C and the second electrode 20C is prevented, and therefore a deterioration in an SN ratio of a signal to be read out can be prevented.

Figure 5:
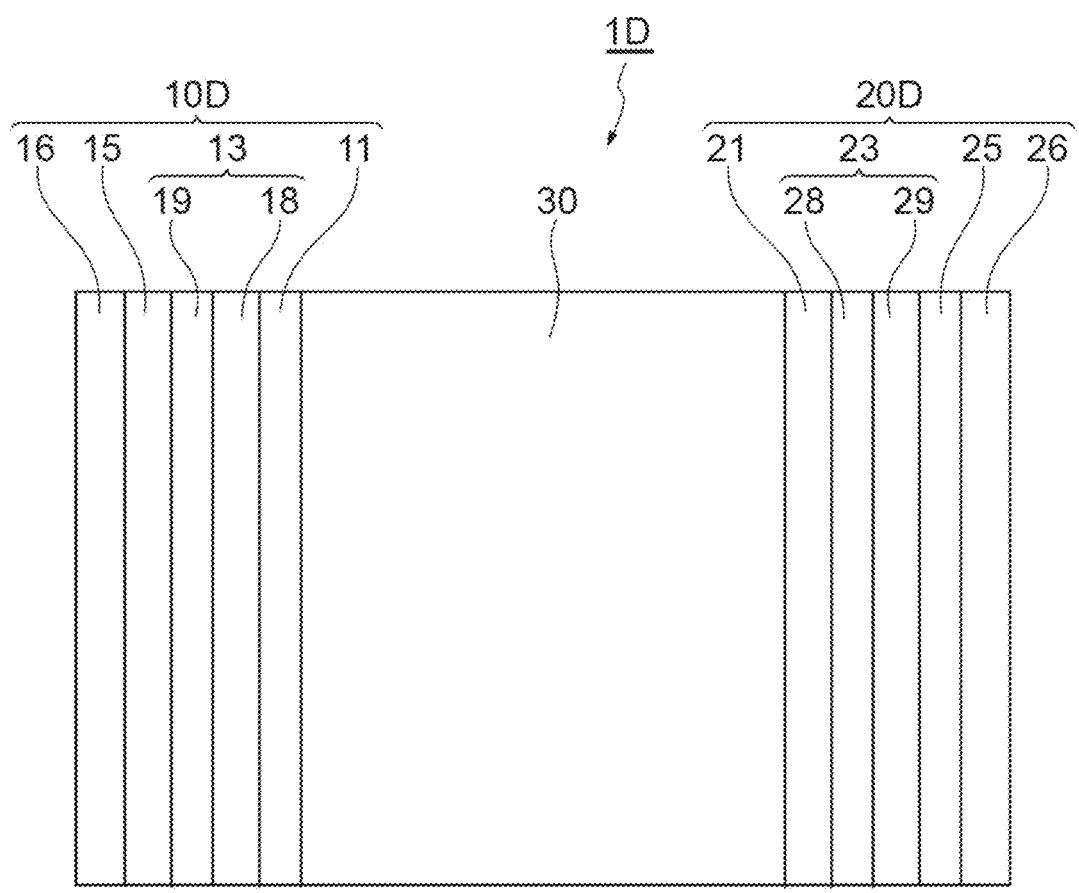
FIG. 5 is a diagram illustrating a cross-sectional configuration of a radiation detector 1D in a variation of the second embodiment.

FIG. 5 is a diagram illustrating a cross-sectional configuration of a radiation detector 1D in a variation of the second embodiment. The radiation detector 1D has a flat-plate shaped structure in which a first electrode 10D and a second electrode 20D have been provided on the thallium bromide (TlBr) crystalline body 30. The first electrode 10D has been formed on one surface (the first electrode formation surface) of two surfaces parallel to each other of the TlBr crystalline body 30, for example, by performing vapor deposition, and the second electrode 20D has been formed on another surface (the second electrode formation surface), for example, by performing vapor deposition.

The first electrode 10D includes the under layer 11, the first layer 13, the intermediate layer 15, and the second layer 16. The second electrode 20D includes the under layer 21, the first layer 23, the intermediate layer 25, and the second layer 26. In comparison with the configuration of the radiation detector 1C (FIG. 4), a configuration of the radiation detector 1D (FIG. 5) is different in that the first electrode 10D further includes the under layer 11 and the intermediate layer 15, and is different in that the second electrode 20D further includes the under layer 21 and the intermediate layer 25.

The under layers 11 and 21 in the configuration of the radiation detector 1D (FIG. 5) correspond to the under layers 11 and 21 in the configuration of the radiation detector 1B (FIG. 2). The intermediate layers 15 and 25 in the configuration of the radiation detector 1D (FIG. 5) correspond to the intermediate layers 15 and 25 in the configuration of the radiation detector 1B (FIG. 2).

The radiation detector 1D (FIG. 5) exhibits functional effects that are similar to functional effects of the radiation detector 1C (FIG. 4). In addition, the under layers 11 and 21 and the intermediate layers 15 and 25 have been provided, and therefore a film structure of each of the first electrode 10D and the second electrode 20D is stabler.

Next, an example of a method for producing the radiation detector 1D (FIG. 5) is described. The radiation detector 1D (FIG. 5) can also be produced by sequentially performing the respective processes illustrated in the flowchart of FIG. 3. However, in comparison with the method for producing the radiation detector 1B (FIG. 2), in the method for producing the radiation detector 1D (FIG. 5), the content of each of the TlBr crystalline body making process S1, the under layer forming process S2, and the intermediate layer forming process S4 is similar, but the content of each of the first layer forming process S3 and the second layer forming process S5 is different.

In the first layer forming process S3, the thallium layer 18 containing metallic Tl or the Tl alloy is formed on the under layer 11 by performing vapor deposition, and then, the first metal layer 19 is formed. Therefore, the first layer 13 in which the thallium layer 18 and the first metal layer 19 have been stacked is formed. In a case where the thallium layer 18 containing the Tl alloy is formed, metallic Tl and another metal are put in advance as raw materials in a tungsten boat or an alumina crucible at an appropriate weight ratio, and are heated in a vacuum chamber in which pressure has been reduced to $10^{-3}$ Pa or lower. As a result of this, metallic Tl and the other metal are alloyed. Then, the thallium layer 18 is formed on the under layer 11 by performing vapor deposition, by using this alloy as an evaporation source. Furthermore, adhesive force or electrical stability of the thallium layer 18 can be improved by heating the TlBr crystalline body 30 in a stage before or after vapor deposition or during vapor deposition of the thallium layer 18.

In the second layer forming process S5, heating treatment is performed after the layer of the second metal has been formed on the intermediate layer 15 by performing vapor deposition. For example, heating is performed at 140° C. for three hours. By performing this heating treatment, the first metal that has diffused from the first metal layer 19 of the first layer 13 and the second metal that has been vapor-deposited are alloyed, and the second layer 16 containing the alloy of the first metal and the second metal is formed.

By performing the above, the first electrode 10D is formed on one surface (the first electrode formation surface) of the TlBr crystalline body 30. After the TlBr crystalline body 30 in which the first electrode 10D has been formed has been sufficiently cooled down, the second electrode 20D is formed. Stated another way, the under layer 21, the first layer 23, the intermediate layer 25, and the second layer 26 are sequentially formed in a similar manner on another polished surface (the second electrode formation surface) of the TlBr crystalline body 30 that is opposite to the surface on which the first electrode 10D has been formed, and therefore the second electrode 20D is formed. By performing the above, the radiation detector 1D (FIG. 5) is obtained.

Note that in the second layer forming process S5, heating treatment may be performed after the layer of the second metal has been formed on both the intermediate layers 15 and 25 by performing vapor deposition. By performing this heating treatment, the alloy of the first metal and the second metal can be simultaneously formed in both the second layers 16 and 26.

Third Embodiment

Figure 6:
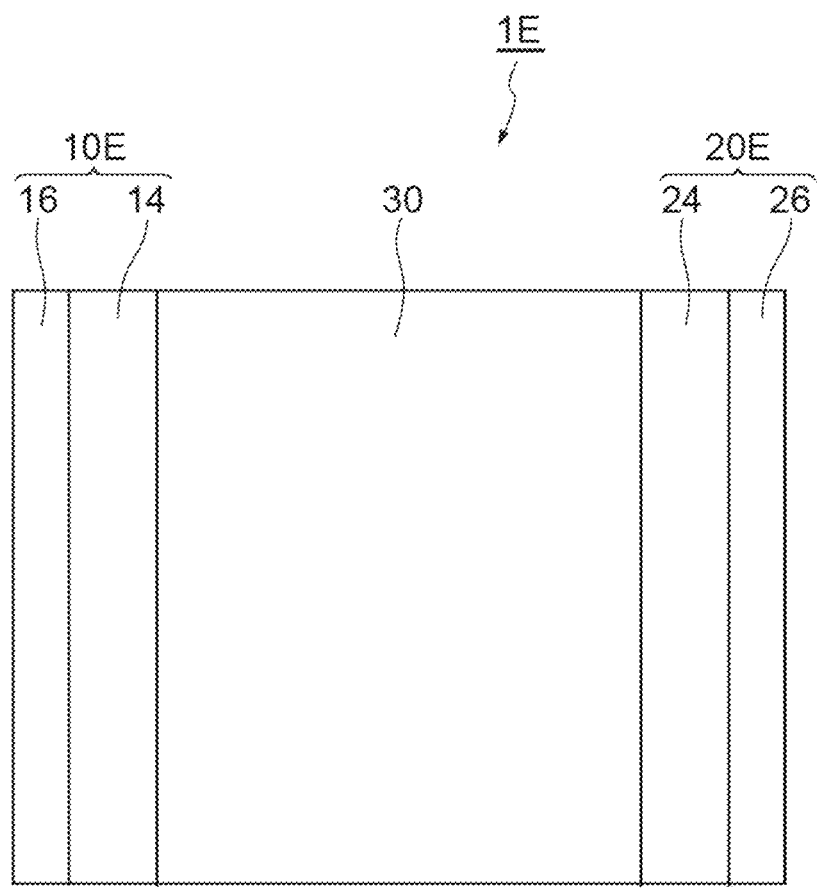
FIG. 6 is a diagram illustrating a cross-sectional configuration of a radiation detector 1E according to a third embodiment.

FIG. 6 is a diagram illustrating a cross-sectional configuration of a radiation detector 1E according to a third embodiment. The radiation detector 1E has a flat-plate shaped structure in which a first electrode 10E and a second electrode 20E have been provided on the thallium bromide (TlBr) crystalline body 30. The first electrode 10E has been formed on one surface (the first electrode formation surface) of two surfaces parallel to each other of the TlBr crystalline body 30, for example, by performing vapor deposition, and the second electrode 20E has been formed on another surface (the second electrode formation surface), for example, by performing vapor deposition.

The first electrode 10E includes a first layer 14 and the second layer 16. The first layer 14 formed on the first electrode formation surface of the TlBr crystalline body 30 contains an alloy of metallic thallium and the first metal. It is preferable that the first layer 14 contain the first metal in excess of a stoichiometric composition of the alloy of metallic thallium and the first metal. The second layer 16 formed on the first layer 14 contains the alloy of the first metal and the second metal. The second layer 16 is lower in resistance than the first layer 14.

The second electrode 20E includes a first layer 24 and the second layer 26. The first layer 24 formed on the second electrode formation surface of the TlBr crystalline body 30 contains the alloy of metallic thallium and the first metal. It is preferable that the first layer 24 contain the first metal in excess of a stoichiometric composition of the alloy of metallic thallium and the first metal. The second layer 26 formed on the first layer 24 contains the alloy of the first metal and the second metal. The second layer 26 is lower in resistance than the first layer 24.

In comparison with the configuration of the radiation detector 1A (FIG. 1), a configuration of the radiation detector 1E (FIG. 6) is different in that the first layers 14 and 24 contain the alloy of metallic thallium and the first metal, and contain the first metal in excess.

Thicknesses of the first layers 14 and 24 are, for example, several tens of nm to several hundreds of nm. The first layers 14 and 24 contain the alloy of metallic thallium and the first metal, and contain the first metal in excess of a stoichiometric composition of this alloy. The first metal contained in the first layers 14 and 24 is the same as the first metal described in the first embodiment. The second layers 16 and 26 in the configuration of the radiation detector 1E (FIG. 6) correspond to the second layers 16 and 26 in the configuration of the radiation detector 1A (FIG. 1).

In the radiation detector 1E, similarly, a diffusion coefficient of metallic Tl with respect to a layer of the alloy of the first metal and the second metal in the second layers 16 and 26 is smaller than a diffusion coefficient of metallic Tl with respect to a layer of the second metal. As a result of this, even if metallic Tl that has been present in the first layers 14 and 24 immediately after making has diffused with the lapse of time, the layer of the alloy of the first metal and the second metal in the second layers 16 and 26 prevents the diffusion of metallic Tl, and deposition of metallic Tl on surfaces of the second layers 16 and 26 is prevented. Then, corrosion of the first electrode 10E and the second electrode 20E is prevented, and therefore a deterioration in an SN ratio of a signal to be read out can be prevented.

Figure 7:
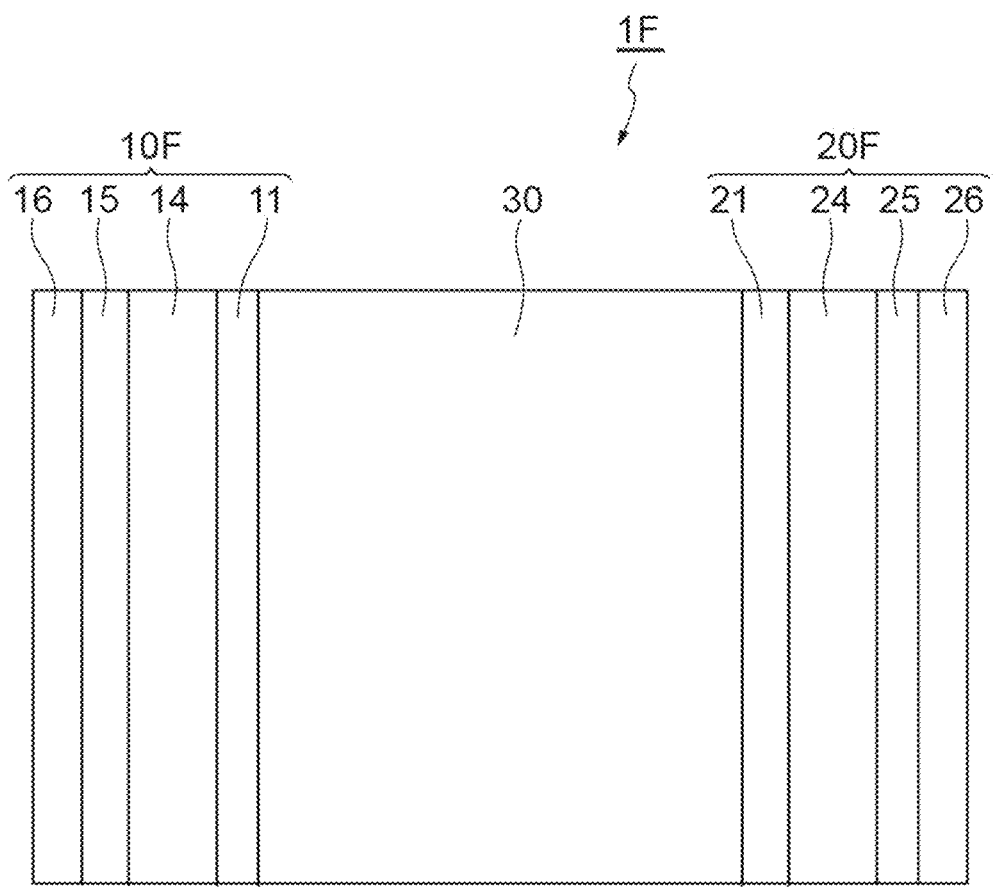
FIG. 7 is a diagram illustrating a cross-sectional configuration of a radiation detector 1F in a variation of the third embodiment.

FIG. 7 is a diagram illustrating a cross-sectional configuration of a radiation detector 1F in a variation of the third embodiment. The radiation detector 1F has a flat-plate shaped structure in which a first electrode 10F and a second electrode 20F have been provided on the thallium bromide (TlBr) crystalline body 30. The first electrode 10F has been formed on one surface (the first electrode formation surface) of two surfaces parallel to each other of the TlBr crystalline body 30, for example, by performing vapor deposition, and the second electrode 20F has been formed on another surface (the second electrode formation surface), for example, by performing vapor deposition.

The first electrode 10F includes the under layer 11, the first layer 14, the intermediate layer 15, and the second layer 16. The second electrode 20F includes the under layer 21, the first layer 24, the intermediate layer 25, and the second layer 26. In comparison with the configuration of the radiation detector 1E (FIG. 6), a configuration of the radiation detector 1F (FIG. 7) is different in that the first electrode 10F further includes the under layer 11 and the intermediate layer 15, and is different in that the second electrode 20F further includes the under layer 21 and the intermediate layer 25.

The under layers 11 and 21 in the configuration of the radiation detector 1F (FIG. 7) correspond to the under layers 11 and 21 in the configuration of the radiation detector 1B (FIG. 2). The intermediate layers 15 and 25 in the configuration of the radiation detector 1F (FIG. 7) correspond to the intermediate layers 15 and 25 in the configuration of the radiation detector 1B (FIG. 2).

The radiation detector 1F (FIG. 7) exhibits functional effects that are similar to functional effects of the radiation detector 1E (FIG. 6). In addition, the under layers 11 and 21 and the intermediate layers 15 and 25 have been provided, and therefore a film structure of each of the first electrode 10F and the second electrode 20F is stabler.

Next, an example of a method for producing the radiation detector 1F (FIG. 7) is described. The radiation detector 1F (FIG. 7) can also be produced by sequentially performing the respective processes illustrated in the flowchart of FIG. 3. However, in comparison with the method for producing the radiation detector 1B (FIG. 2), in the method for producing the radiation detector 1F (FIG. 7), the content of each of the TlBr crystalline body making process S1, the under layer forming process S2, and the intermediate layer forming process S4 is similar, but the content of each of the first layer forming process S3 and the second layer forming process S5 is different.

In the first layer forming process S3, the first layer 14 that contains the alloy of metallic thallium and the first metal and contains the first metal in excess is formed on the under layer 11 by performing vapor deposition. In this vapor deposition, metallic Tl and the first metal are put in advance as raw materials in a tungsten boat or an alumina crucible at an appropriate weight ratio (a weight ratio that causes the first metal to have a weight in excess of an alloy ratio required to form the alloy of metallic thallium and the first metal), and are heated in a vacuum chamber in which pressure has been reduced to $10^{-3}$ Pa or lower. As a result of this, the alloy of metallic Tl and the first metal, and the first metal in excess are prepared. Then, the first layer 14 is formed on the under layer 11 by performing vapor deposition, by using this alloy and the first metal in excess as evaporation sources. Furthermore, adhesive force or electrical stability of the first layer 14 can be improved by heating the TlBr crystalline body 30 in a stage before or after the first layer 14 is vapor-deposited or during vapor deposition.

In the second layer forming process S5, heating treatment is performed after the layer of the second metal has been formed on the intermediate layer 15 by performing vapor deposition. For example, heating treatment is performed at 140° C. for three hours. By performing this heating treatment, the first metal that has diffused from the first layer 14 and the second metal that has been vapor-deposited are alloyed, and the second layer 16 containing the alloy of the first metal and the second metal is formed.

By performing the above, the first electrode 10F is formed on one surface (the first electrode formation surface) of the TlBr crystalline body 30. After the TlBr crystalline body 30 in which the first electrode 10F has been formed has been sufficiently cooled down, the second electrode 20F is formed. Stated another way, the under layer 21, the first layer 24, the intermediate layer 25, and the second layer 26 are sequentially formed in a similar manner on another polished surface (the second electrode formation surface) of the TlBr crystalline body 30 that is opposite to the surface on which the first electrode 10F has been formed, and the second electrode 20F is formed. By performing the above, the radiation detector 1F (FIG. 7) is obtained.

Note that in the second layer forming process S5, heating treatment may be performed after the layer of the second metal has been formed on both the intermediate layers 15 and 25 by performing vapor deposition. By performing this heating treatment, the alloy of the first metal and the second metal can be simultaneously formed in both the second layers 16 and 26.

(Embodiment of Detector Module)

Figure 8:
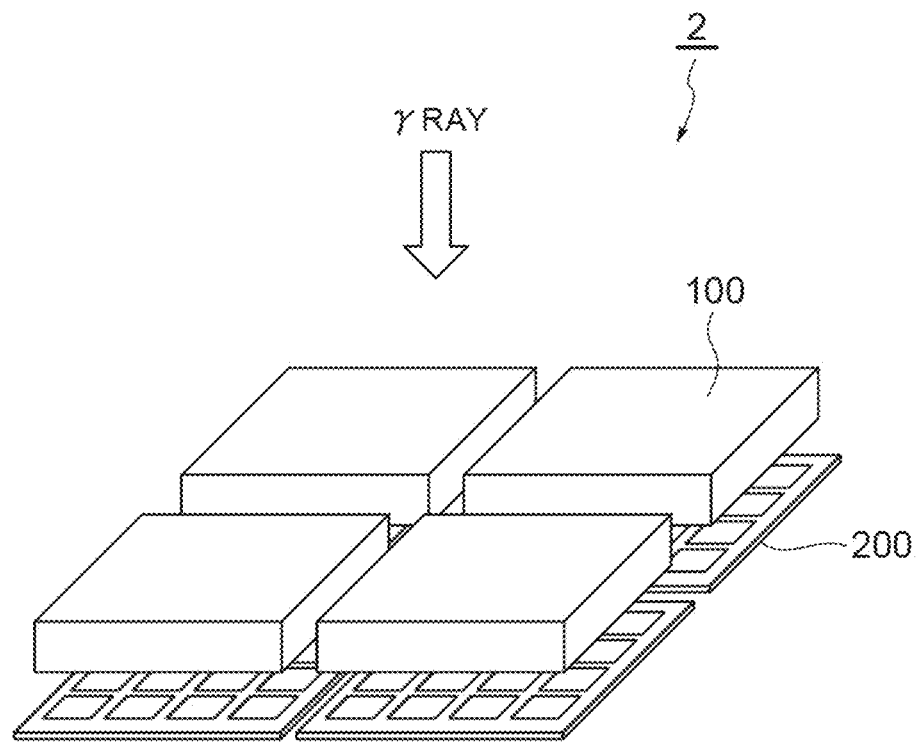
FIG. 8 is a perspective view illustrating a general configuration of a detector module 2.

FIG. 8 is a perspective view illustrating a general configuration of a detector module 2. The detector module 2 includes one or more radiation detectors 100 and a readout circuit board 200. The radiation detector 100 has a configuration that is similar to a configuration of any of the radiation detectors 1A to 1F described above. Note that in the radiation detectors 1A to 1F that are applied to the radiation detector 100, the first and second electrodes may have electrode structures that are different from each other, and any of the first electrode and the second electrode may have an electrode structure that is different from the structure illustrated in each of FIGS. 1, 2, and 4 to 7 (for example, it is constituted by a layer of only a low-resistance metal such as gold or platinum). The readout circuit board 200 is electrically connected to an electrode of the radiation detector 100, and is provided with a circuit that receives, as an input, a signal that has been outputted from the radiation detector 100 in response to detection of radiation (for example, gamma rays) performed by the radiation detector 100, and processes the signal.

Figure 9:
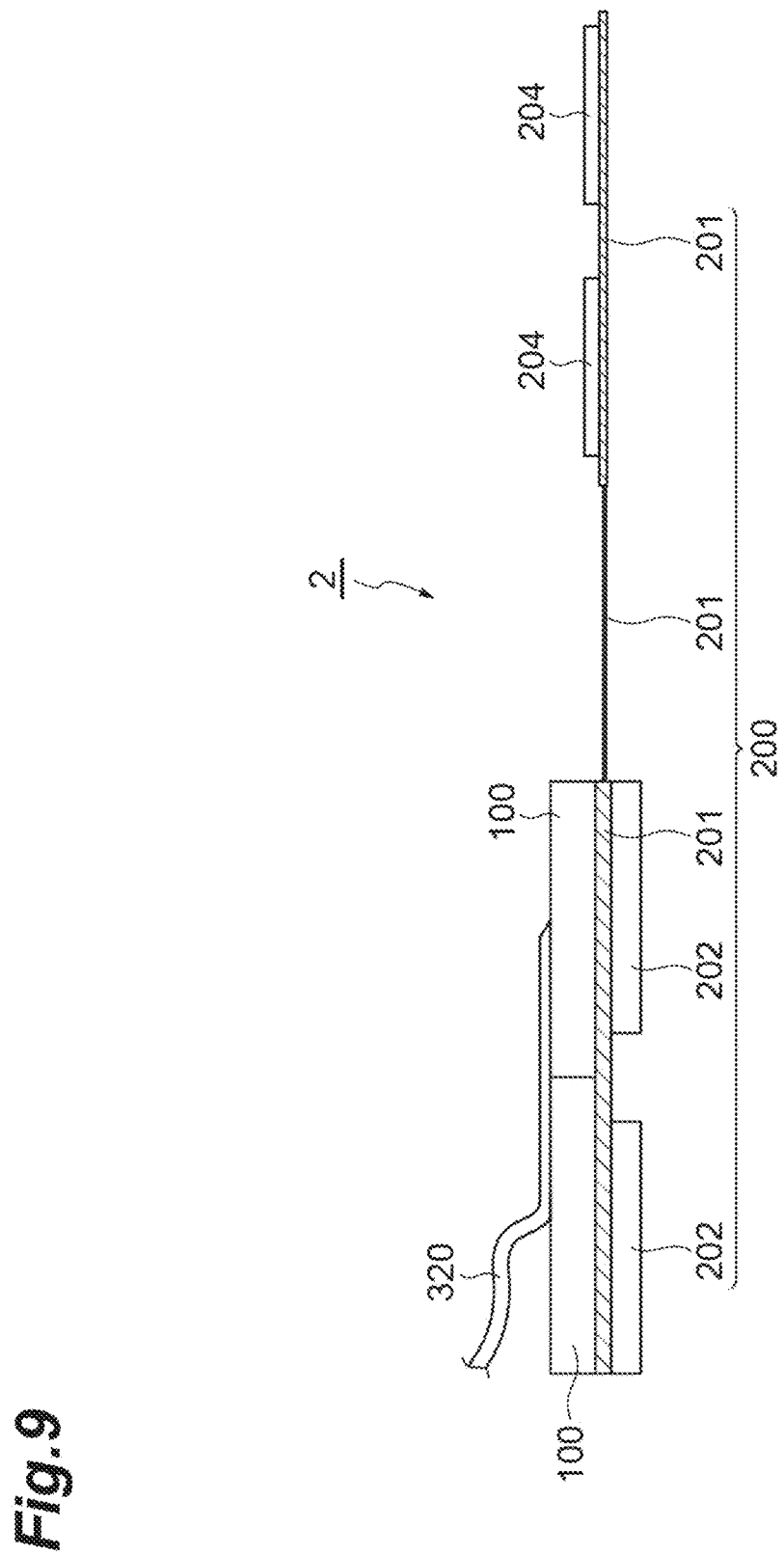
FIG. 9 is a cross-sectional view illustrating a configuration of the detector module 2.

FIG. 9 is a cross-sectional view illustrating a configuration of the detector module 2. The readout circuit board 200 is mounted with the one or more radiation detectors 100 on a first surface of a board 201, and is mounted with one or more signal processing circuits 202 on a second surface of the board 201. Furthermore, the readout circuit board 200 is mounted with one or more connectors 204 on the first surface of the board 201. The board 201 is, for example, a flexible printed circuit board. An electrode pad is provided on the first surface of the board 201, and this electrode pad is electrically connected to the electrode of the radiation detector 100. The board 201 includes a through-electrode that electrically connects this electrode pad and the signal processing circuit 202. The signal processing circuit 202 receives, as an input, a signal that has been outputted from the radiation detector 100, and has arrived via the though-electrode, and processes the signal. The connector 204 is electrically connected to the signal processing circuit 202 via a wiring line formed on the board 201. The connector 204 receives, as an input, a control signal for controlling an operation of the signal processing circuit 202 from an outside, and outputs, to the outside, a signal that has been obtained as a result of processing performed by the signal processing circuit 202.

Figure 10:
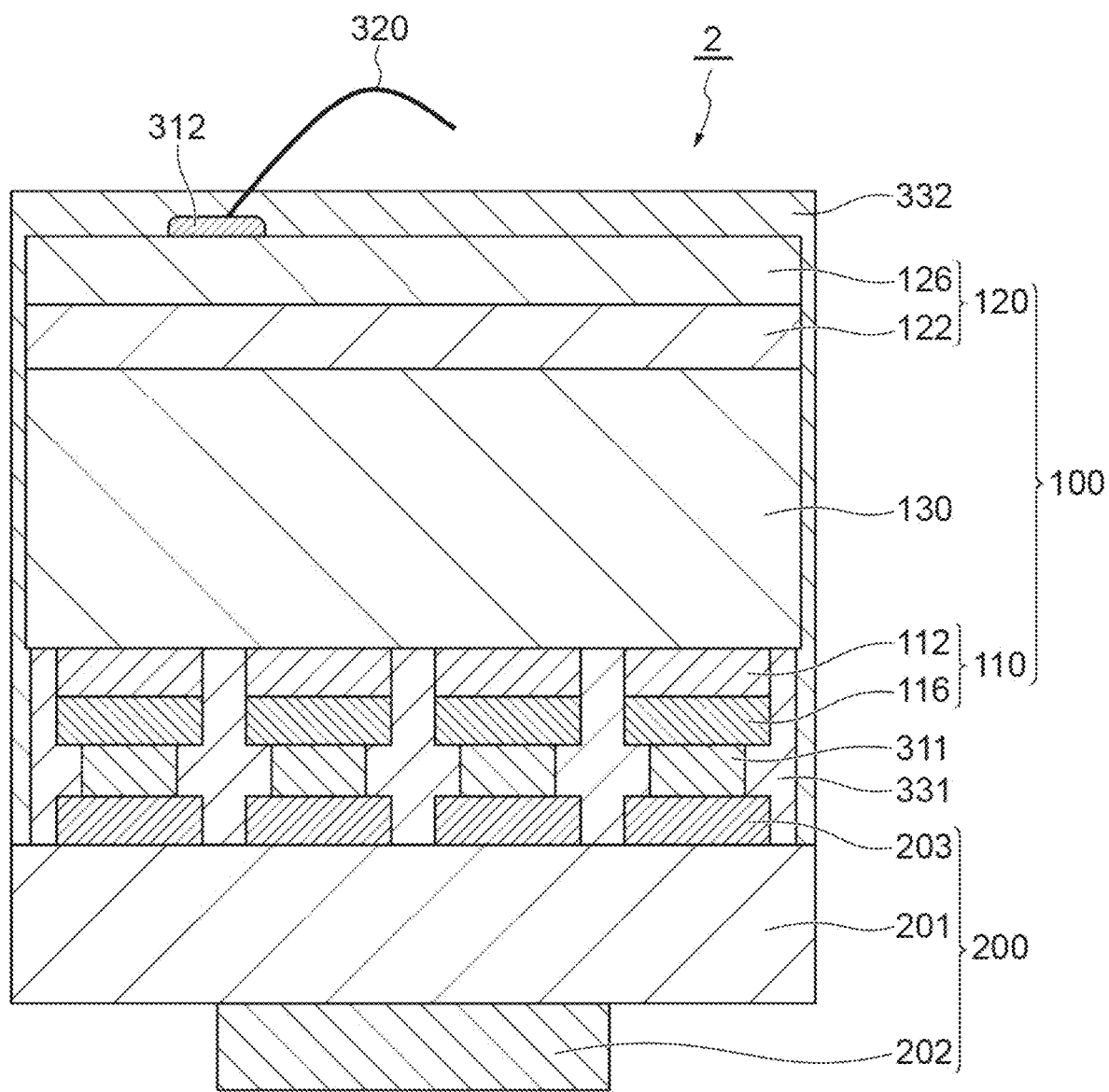
FIG. 10 is a cross-sectional view illustrating a principal configuration of the detector module 2.
Figure 11:
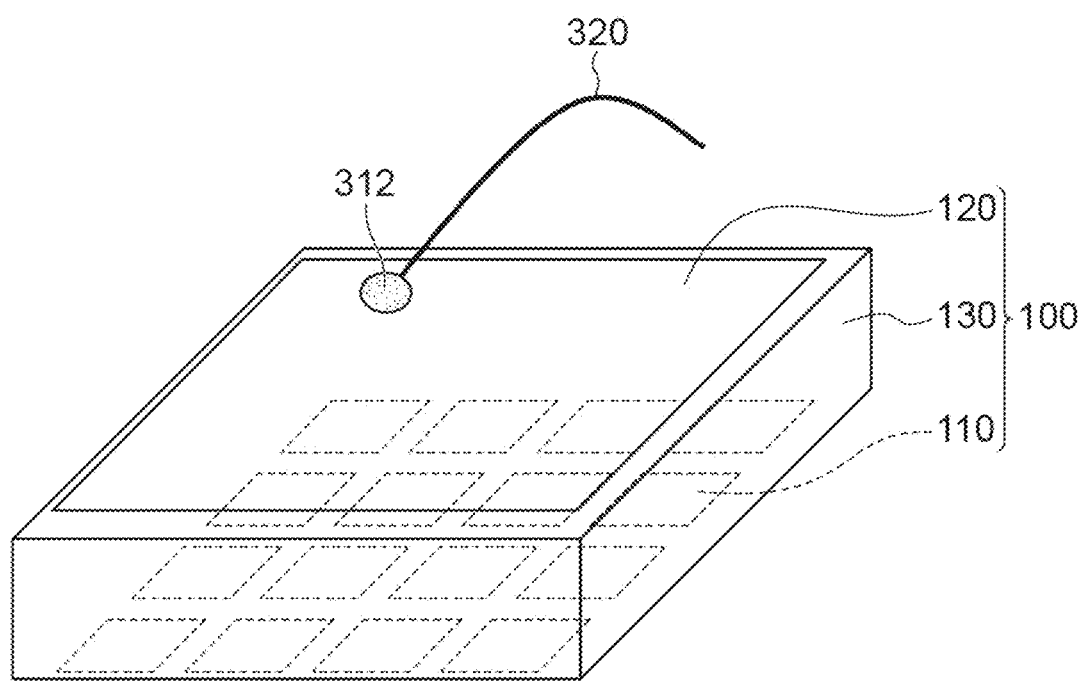
FIG. 11 is a perspective view of a radiation detector 100.
Figure 12:
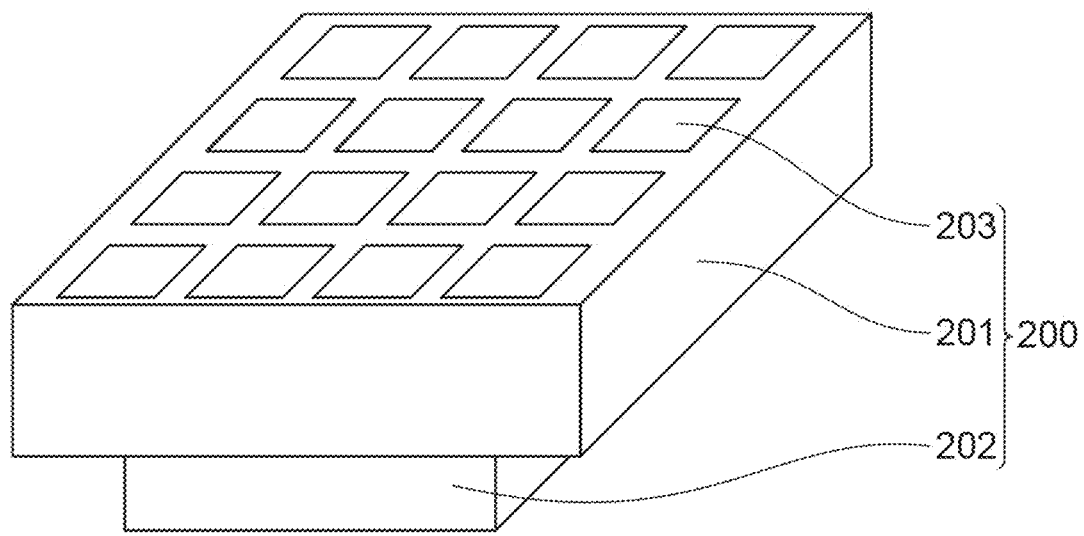
FIG. 12 is a partial perspective view of a readout circuit board 200.

FIG. 10 is a cross-sectional view illustrating a principal configuration of the detector module 2. FIG. 11 is a perspective view of the radiation detector 100. FIG. 12 is a partial perspective view of the readout circuit board 200. A configuration of the detector module 2 is described below with reference to FIGS. 10 to 12.

The radiation detector 100 includes a first electrode 110 that includes a first layer 112 and the second layer 116, a second electrode 120 that includes a first layer 122 and a second layer 126, and a TlBr crystalline body 130. In the configuration illustrated in FIGS. 10 to 12, in a single radiation detector 100, 4×4 pieces of first electrodes 110 have been provided in a two-dimensional array shape on a lower surface (a surface that faces the readout circuit board 200) of the TlBr crystalline body 130, and a single common second electrode 120 has been provided on an upper surface of the TlBr crystalline body 130. It is preferable that the second electrode 120 have been provided to cover almost the entirety of the upper surface of the TlBr crystalline body 130. The number of pixels of a single radiation detector 100 is 16, which is the same as the number of first electrodes 110. The second electrode 120 provided on the upper surface of the TlBr crystalline body 130 is electrically connected to a bias line 320 by using a conductive adhesive 312. This bias line 320 may have a wire shape, or may have a film shape.

In the readout circuit board 200, 4×4 pieces of electrode pads 203 have been provided in a two-dimensional array shape on an upper surface (a surface that faces the radiation detector 100) of the board 201, and the signal processing circuit 202 has been provided on a lower surface of the board 201. The first electrode 110 of the radiation detector 100 and the electrode pad 203 of the readout circuit board 200 are electrically connected to each other in one-to-one correspondence by using a conductive adhesive 311.

It is preferable that the conductive adhesives 311 and 312 be adhesives that are curable by heating at a low temperature of 160° C. or less, because a TlBr crystal has a low meting point and a large coefficient of thermal expansion. As the conductive adhesives 311 and 312, for example, an Ni-filler type conductive adhesive, an Ag-filler type conductive adhesive, a C-filler type conductive adhesive, a low-temperature solder paste Sn—Bi type, or the like can be used. The conductive adhesives 311 and 312 can be applied by using a dispenser or a printing process.

A space between the radiation detector 100 and the readout circuit board 200 is filled with an insulating underfill material 331. The underfill material 331 covers the first electrode 110 of the radiation detector 100, the electrode pad 203 of the readout circuit board 200, and the conductive adhesive 311. This underfill material 331 is provided in order to improve strength and a temperature resistance characteristic of the detector module 2. It is preferable that the underfill material 331 be a low thermal expansion resin material. The underfill material 331 may be a material that contains silica, or may be a material that does not contain silica, but only contains epoxy.

The radiation detector 100 on the readout circuit board 200 is covered with an insulating protective film 332. It is preferable that the protective film 332 cover the entirety of an upper surface of the readout circuit board 200. This protective film 332 is provided for moisture proofing. It is preferable that the protective film 332 be, for example, a resin material that can be applied in a thin film shape having a thickness of 10 μm to 200 μm, and it is also preferable that the protective film 332 be a resin film that is cured at an ordinary temperature or a temperature of 100° C. or less. As the protective film 332, for example, an acrylic resin, a polyolefin resin, a urethane resin, a silicone resin, or the like can be used.

The radiation detector 100 is covered with the underfill material 331 and the protective film 332, and is prevented from coming into contact with the atmosphere. As a result of this, in the detector module 2, strength and a temperature resistance characteristic are improved, and in addition, long-term reliability is secured.

(Variations)

The present invention is not limited to the embodiments described above, and various variations can be made. For example, in forming a Tl—Bi alloy layer in the first layer, vapor deposition is first performed on one of Tl and Bi, and vapor deposition is performed on another, and then heating treatment is performed, instead of forming the Tl—Bi alloy layer by performing vapor deposition, by using, as a vapor deposition source, an alloy of Tl and Bi that has been made in advance. As a result of this, the Tl—Bi alloy layer may be formed. Furthermore, in forming an Au—Bi alloy layer in the second layer, vapor deposition is first performed on one of Au and Bi, and vapor deposition is performed on another, and then heating treatment is performed to form the Au—Bi alloy layer, instead of forming the Au—Bi alloy layer by performing vapor deposition, by using, as a vapor deposition source, an alloy of Au and Bi that has been made in advance. As a result of this, the Au—Bi alloy layer may be formed Either the first electrode or the second electrode may be constituted by a layer of only a low-resistance metal such as gold or platinum. In the detector module 2 illustrated in FIGS. 8 to 12, the second electrode 120 serving as a common electrode may be constituted by a layer of only a low-resistance metal such as Au or Pt, depending on usage.

EXAMPLES

First Example

Figure 13:
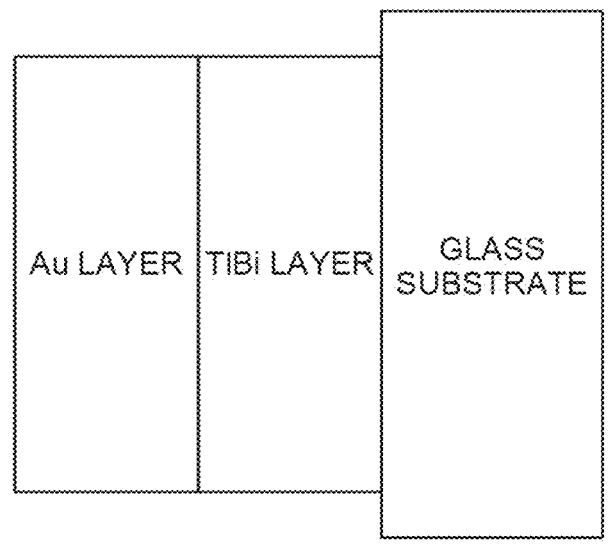
FIG. 13 is a diagram illustrating a laminate structure of Sample A.
Figure 14:
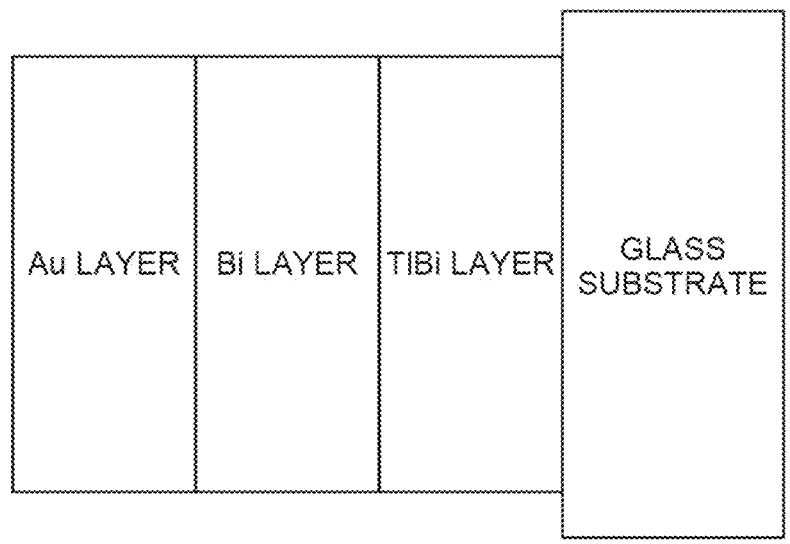
FIG. 14 is a diagram illustrating a laminate structure of Samples B to D.

Composition analysis was conducted on Samples A to D described below. FIG. 13 is a diagram illustrating a laminate structure of Sample A. Sample A has a structure in which a TlBr alloy layer and a gold (Au) layer have been sequentially formed on a glass substrate that simulates a TlBi crystalline body. In Sample A, a bismuth (Bi) layer has not been provided between the TlBi alloy layer and the Au layer. FIG. 14 is a diagram illustrating a lamnate structure of Samples B to D. Samples B to D have a structure in which the TlBi alloy layer, the bismuth (Bi) layer, and the gold (Au) layer have been sequentially formed on the glass substrate that simulates the TlBr crystalline body.

In composition analysis of each of the samples, a microprobe X-ray photoelectron spectroscopy (µXPS) device and an X-ray diffraction (XRD) device were used. The µXPS device can obtain information relating to composition and a chemical bonding condition of a sample by measuring energy of photoelectrons that have been emitted from a surface of the sample when X-rays have been made incident on the sample. Furthermore, the µXPS device can obtain information relating to composition and a chemical bonding condition in each position in a depth direction of a sample, by using the µXPS device together with, for example, an Ar sputtering device. The XRD device can obtain a relationship between an angle of diffraction and a diffraction intensity for diffracted light that has been generated when X-rays having a known wavelength have been made incident on a sample, and can analyze the composition of the sample on the basis of this relationship.

Figure 15:
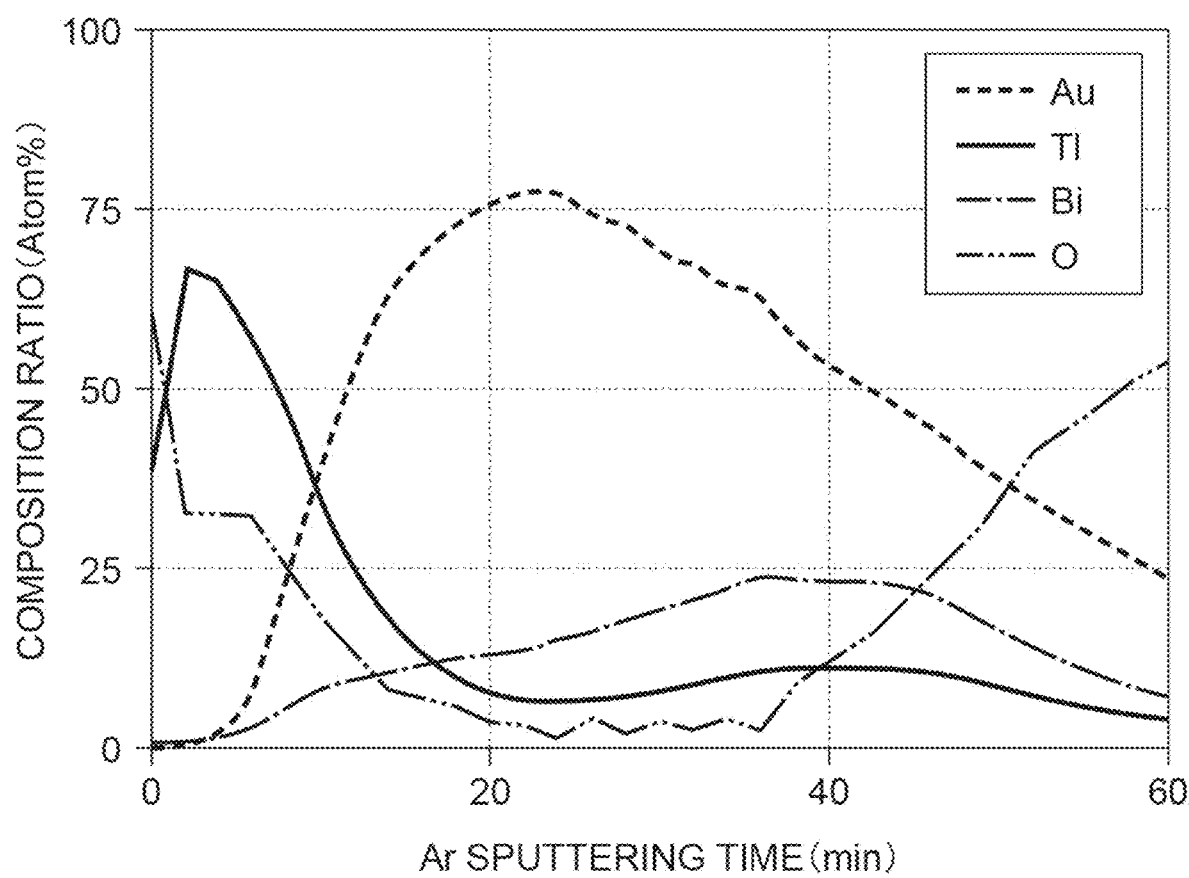
FIG. 15 is a graph illustrating a µXPS analysis result of Sample A in which a Bi layer has not been provided.

FIG. 15 is a graph illustrating a µXPS analysis result of Sample A in which the Bi layer has not been provided. A horizontal axis of this graph indicates Ar sputtering time (that is, a position in the depth direction of a sample), and a vertical axis indicates a composition ratio (atom %). In this Sample A, a large amount of metallic Tl is deposited on a surface of the Au layer, and many oxygen (O) elements are present. Metallic Tl deposited on the surface of the Au layer is oxidized, and thallium oxide ($TlO_2$) is generated. Thallium oxide reacts with moisture in the atmosphere, and strongly basic thallium hydroxide (TlOH) having high corrosiveness is generated. This is a factor of a deterioration in an SN ratio of a signal to be read out.

Figure 16:
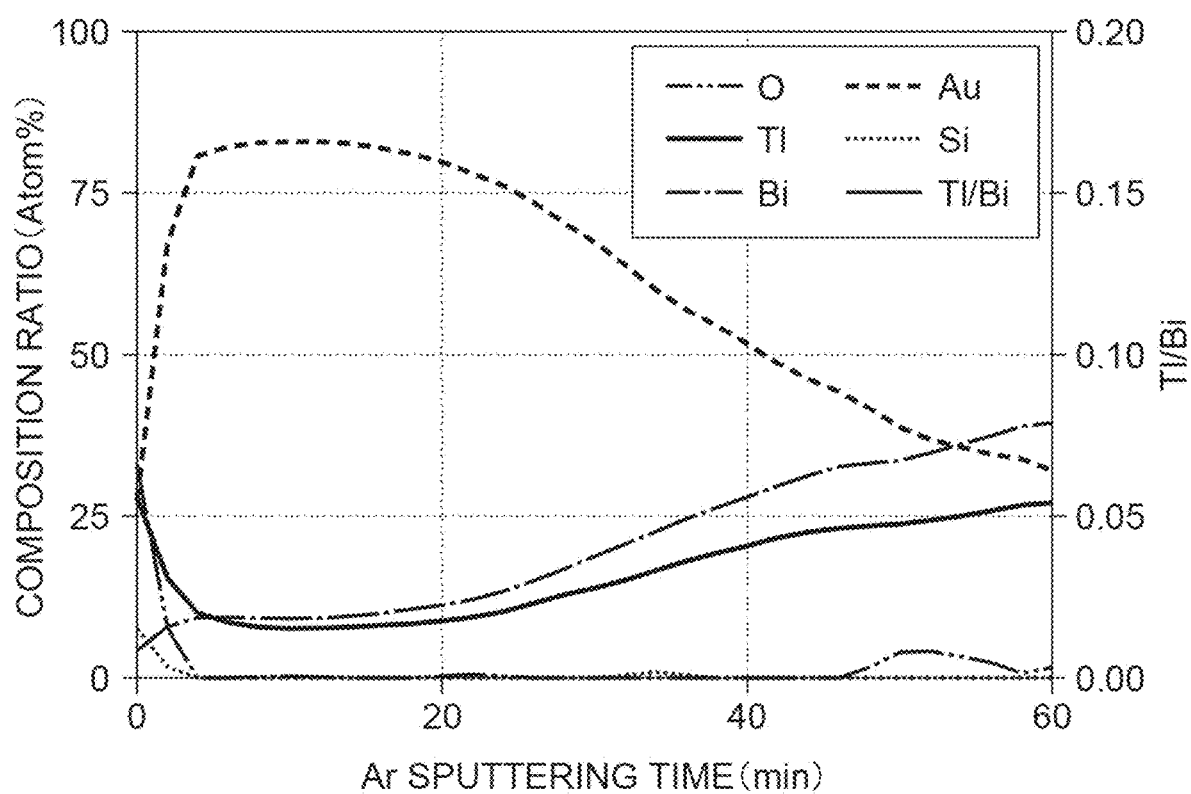
FIG. 16 is a graph illustrating a µXPS analysis result of Sample B in which the Bi layer has been provided immediately after Au vapor deposition in a case where heating was not performed after Au vapor deposition.

FIG. 16 is a graph illustrating a µXPS analysis result of Sample B in which the Bi layer has been provided immediately after Au vapor deposition in a case where heating was not performed after Au vapor deposition. In this Sample B, immediately after Au vapor deposition, an amount of deposition of metallic Tl on the surface of the Au layer is not large.

Figure 17:
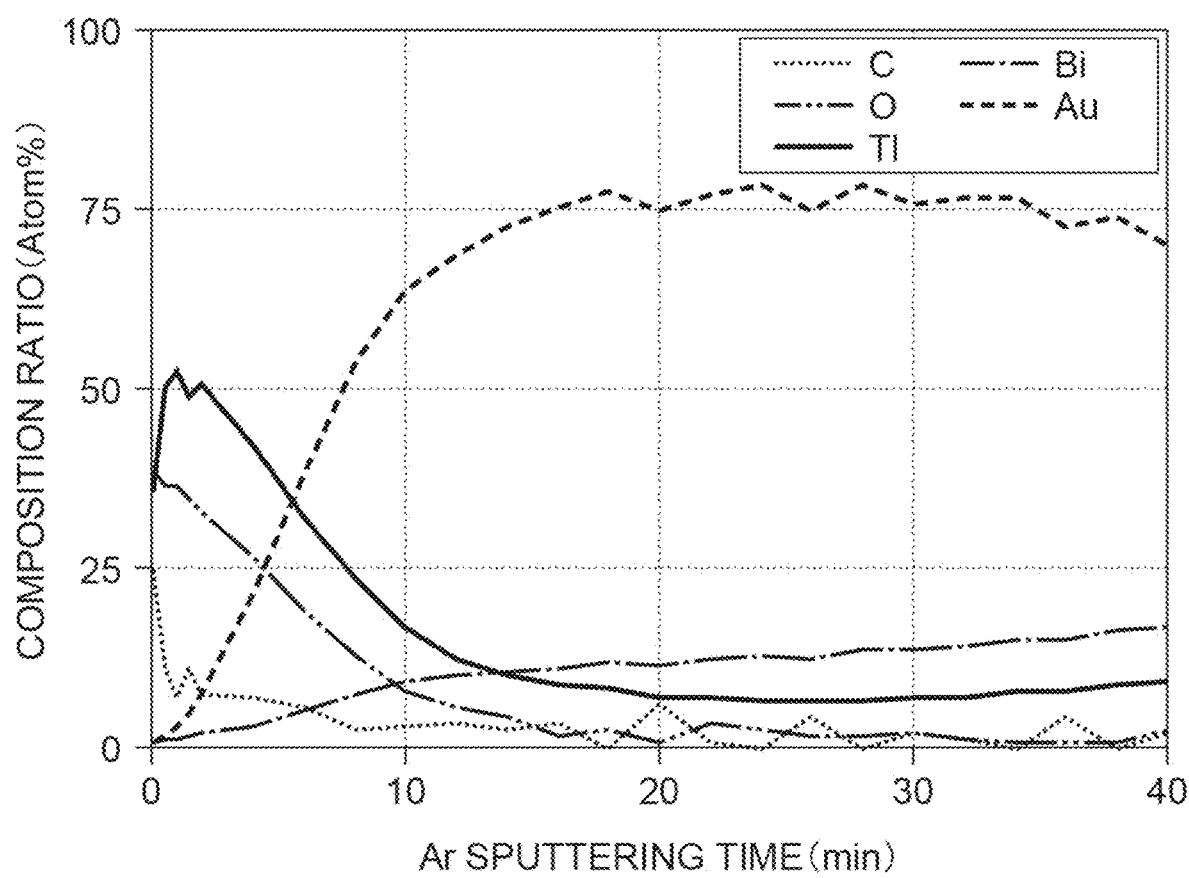
FIG. 17 is a graph illustrating a µXPS analysis result of Sample C in which the Bi layer has been provided after the lapse of one week in a case where heating was not performed after Au vapor deposition.

FIG. 17 is a graph illustrating a µXPS analysis result of Sample C in which the Bi layer has been provided after the lapse of one week in a case where heating was not performed after Au vapor deposition. In comparison between the µXPS analysis result (FIG. 16) of Sample B (immediately after Au vapor deposition) and the µXPS analysis result (FIG. 17) of Sample C (after the lapse of one week), in Sample C, a large amount of metallic Tl is deposited on the surface of the Au layer while one week passes after Au vapor deposition. Accordingly, in this Sample C, similarly to Sample A, thallium hydroxide (TlOH) is generated, and this is a factor of a deterioration in an SN ratio of a signal to be read out.

Figure 18:
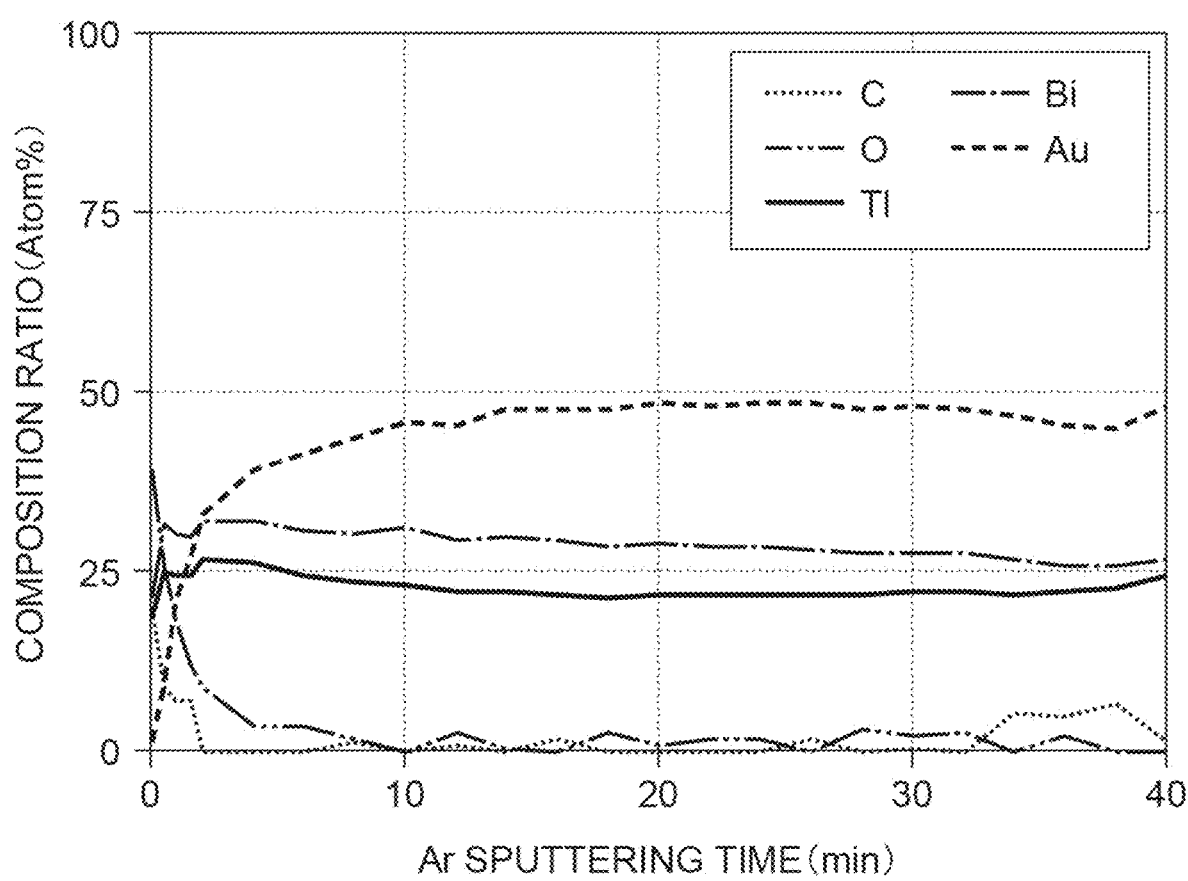
FIG. 18 is a graph illustrating a µXPS analysis result of Sample D in which the Bi layer has been provided after the lapse of one week in a case where heating was performed after Au vapor deposition.

FIG. 18 is a graph illustrating a µXPS analysis result of Sample D in which the Bi layer has been provided after the lapse of one week in a case where heating was performed after Au vapor deposition. Sample D was heated at a temperature of 140° C. for three hours, and therefore the alloy of Bi that diffused from the Bi layer and Au was formed. In comparison between the µXPS analysis result (FIG. 17) of Sample C (not heated, after the lapse of one week) and the µXPS analysis result (FIG. 18) of Sample D (heated, after the lapse of one week), in Sample D, an amount of deposition of metallic Tl on the surface of the Au layer is not large, even one week after Au vapor deposition. Accordingly, in this Sample D, generation of thallium hydroxide (TlOH) is prevented, and a deterioration in an SN ratio of a signal to be read out is prevented.

Note that µXPS analysis was conducted on Samples C and D, after Samples C and D were stored in a reduced-pressure atmosphere for one week after Au vapor deposition. This is because deposition of metallic Tl on the surface of the Au layer becomes stable during this one-week storage, and then, a change in an amount of deposition of metallic Tl on the surface of the Au layer is small. Furthermore, Sample D simulates the radiation detector 1C (FIG. 4) after heating in which the first layer (the TlBi alloy layer and the Bi layer) and the second layer (the Au layer) have been formed on the TlBr crystalline body.

Figure 19:
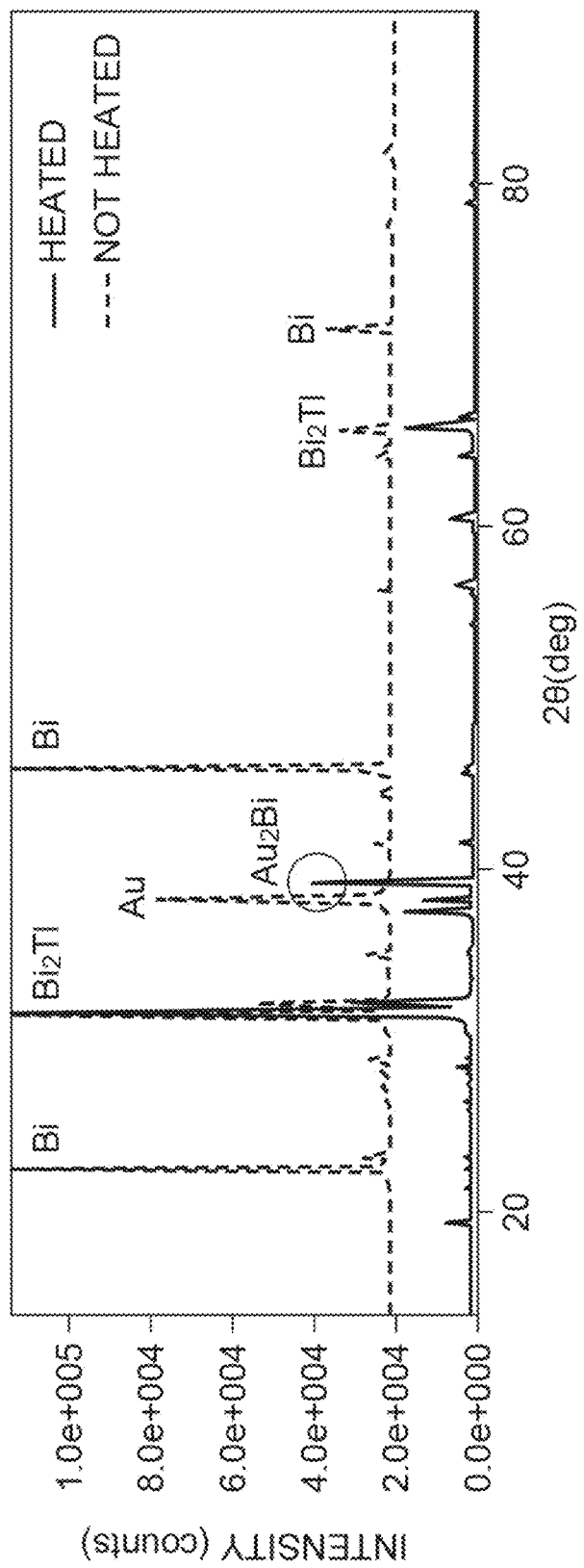
FIG. 19 is a graph illustrating XRD analysis results of Samples C and D in which the Bi layer has been provided one week after Au vapor deposition.

FIG. 19 is a graph illustrating XRD analysis results of Samples C and D in which the Bi layer has been provided one week after Au vapor deposition. A horizontal axis of this graph indicates an angle of diffraction, and a vertical axis indicates a diffraction intensity (a counted value of a photoelectron). Both Sample C (not heated) and Sample D (heated) were vapor-deposited onto the glass substrate, by using, as a vapor deposition source, an alloy made by heating and melting Bi metal and metallic Tl, and therefore the presence of an alloy of Bi and Tl ($Bi_2Tl$) is observed at a similar level. However, in comparison with Sample C (not heated), it is apparent that in Sample D (heated), amounts of a Bi element and an Au element as a single element are small, while an alloy of Bi and Au ($Au_2Bi$) was generated due to heating.

It is apparent from the µXPS analysis result (FIGS. 15 to 18) of each of Samples A to D, and the XRD analysis results (FIG. 19) of Samples C and D that, in the radiation detector 1C (FIG. 4) after heating in which the first layer (the TlBi alloy layer and the Bi layer) and the second layer (the Au layer) have been formed on the TlBr crystalline body, generation of an alloy ($Au_2Bi$) in the second layer prevents deposition of metallic Tl on the surface of the second layer, and corrosion of an electrode is prevented, and therefore a deterioration in an SN ratio of a signal to be read out can be prevented. This is not only applied to the radiation detector 1C (FIG. 4), but is also applied similarly to the radiation detector 1A (FIG. 1), the radiation detector 1B (FIG. 2), the radiation detector 1D (FIG. 5), the radiation detector 1E (FIG. 6), and the radiation detector 1F (FIG. 7) that have another configuration.

Second Example

The following detector module was made, and a fraction defective was obtained. The made detector module had a structure in which four radiation detectors are mounted on a readout circuit board, and in each of the radiation detectors, 64 (=8×8) first electrodes have been formed, and the total number of pixels was 256. In each of the radiation detectors, a TlBr crystalline body had a structure of a flat plate shape of 20 mm×20 mm, and a pitch of the first electrode was 2.5 mm. A configuration of each of the radiation detectors was similar to the configuration of the radiation detector 1C (FIG. 4). A fraction defective of a detector module in a case where an alloy of Bi and Au was formed by performing heating treatment after Au vapor deposition in the second layer forming process decreased to about ¼ in comparison with a fraction defective of a detector module in a case where heating treatment was not performed after Au vapor deposition.

REFERENCE SIGNS LIST 1A to 1F Radiation detector
2 Detector module
10A to 10F First electrode
11 Under layer
12 to 14 First layer
15 Intermediate layer
16 Second layer
18 Thallium layer
19 First metal layer
20A to 20F Second electrode
21 Under layer
22 to 24 First layer
25 Intermediate layer
26 Second layer
28 Thallium layer
29 First metal layer
30 Thallium bromide (TlBr) crystalline body
100 Radiation detector
110 First electrode
112 First layer
116 Second layer
120 Second electrode
122 First layer
126 Second layer
130 Thallium bromide (TlBr) crystalline body
200 Readout circuit board
201 Board
202 Signal processing circuit
203 Electrode pad
204 Connector
311, 312 Conductive adhesive
320 Bias line
331 Underfill material
332 Protective film

The invention claimed is:

1. A radiation detector comprising:
a thallium bromide crystalline body; and
a first electrode and a second electrode respectively provided on electrode formation surfaces set in different positions of the thallium bromide crystalline body, wherein
at least one electrode of the first electrode and the second electrode includes:
a first layer provided on a corresponding electrode formation surface of the electrode formation surfaces, the first layer containing metallic thallium, or a first alloy of the metallic thallium and a metal different from the metallic thallium; and
a second layer provided on the first layer, the second layer containing a second alloy of a first metal and a second metal, and
the first metal and the second metal have been selected to cause a diffusion coefficient of the metallic thallium with respect to a layer comprised of the second alloy to be smaller than the diffusion coefficient of the metallic thallium with respect to a layer comprised of the second metal.

2. The radiation detector according to claim 1, wherein the first layer contains a thallium layer containing the metallic thallium or the first alloy, and a first metal layer that is provided on the thallium layer and contains the first metal.

3. The radiation detector according to claim 1, wherein the first layer contains an alloy of the metallic thallium and the first metal as the first alloy.

4. The radiation detector according to claim 3, wherein the first layer contains the alloy of the metallic thallium and the first metal as the first alloy, and contains the first metal in excess.

5. The radiation detector according to claim 1, wherein the first layer contains, as the first alloy, an alloy of the metallic thallium and one or more metals of lead, silver, bismuth, and indium.

6. The radiation detector according to claim 1, wherein the first metal is one of bismuth, lead, tin, and antimony.

7. The radiation detector according to claim 1, wherein the second metal is one of gold and platinum.

8. The radiation detector according to claim 1, further comprising
an intermediate layer provided between the first layer and the second layer, the intermediate layer being conductive and enhancing adhesive force between the first layer and the second layer.

9. The radiation detector according to claim 8, wherein the intermediate layer contains one of chromium, nickel, and titanium.

10. The radiation detector according to claim 1, further comprising
a conductive under layer provided between the corresponding electrode formation surface and the first layer, the conductive under layer enhancing adhesive force between the corresponding electrode formation surface and the first layer.

11. The radiation detector according to claim 10, wherein the conductive under layer contains one of chromium, nickel, and titanium.

12. A detector module comprising:
the radiation detector according to claim 1; and
a readout circuit board electrically connected to the first electrode or the second electrode of the radiation detector, the readout circuit board being provided with a circuit receiving, as an input, a signal outputted from the radiation detector in response to detection of radiation, and processing the signal.

13. The detector module according to claim 12, wherein the first electrode or the second electrode of the radiation detector is mutually electrically connected to an electrode pad on the readout circuit board by using a conductive adhesive.

14. The detector module according to claim 12, wherein a space between the radiation detector and the readout circuit board is filled with resin.

15. The detector module according to claim 12, wherein the radiation detector on the readout circuit board is covered with resin.

16. A radiation detector production method comprising:
a first process for preparing a thallium bromide crystalline body; and
a second process for respectively forming a first electrode and a second electrode on electrode formation surfaces set in different positions of the thallium bromide crystalline body, wherein
as a process for forming at least one electrode of the first electrode and the second electrode, the second process includes:
a first layer forming process for forming a first layer provided on a corresponding electrode formation surface of the electrode formation surfaces, the first layer containing metallic thallium, or a first alloy of the metallic thallium and a metal different from the metallic thallium; and
a second layer forming process for forming a second layer provided on the first layer, the second layer containing a second alloy of a first metal and a second metal, and
the first metal and the second metal have been selected to cause a diffusion coefficient of the metallic thallium with respect to a layer comprised of the second alloy to be smaller than the diffusion coefficient of the metallic thallium with respect to a layer comprised of the second metal.

17. The radiation detector production method according to claim 16, wherein
in the first layer forming process, the first layer is formed by forming a thallium layer containing the metallic thallium or the first alloy, and stacking a first metal layer containing the first metal on the thallium layer, and
in the second layer forming process, the second layer containing an alloy of the second metal and the first metal diffused from the first layer is formed by forming an upper layer comprised of the second metal on the first layer, and then heating a laminated body constituted by the first layer and the upper layer.

18. The radiation detector production method according to claim 16, wherein
in the first layer forming process, the first layer containing an alloy of the metallic thallium and the first metal as the first alloy is formed, and
in the second layer forming process, the second layer containing the alloy of the second metal and the first metal diffused from the first layer is formed by forming an upper layer comprised of the second metal on the first layer, and then heating a laminated body constituted by the first layer and the upper layer.

19. The radiation detector production method according to claim 18, wherein
in the first layer forming process, the first layer containing the alloy of the metallic thallium and the first metal as the first alloy, and containing the first metal in excess is formed.

20. The radiation detector production method according to claim 16, wherein
in the first layer forming process, the first layer containing, as the first alloy, an alloy of the metallic thallium and one or more metals of lead, silver, bismuth, and indium is formed.

21. The radiation detector production method according to claim 16, wherein
the first metal is one of bismuth, lead, tin, and antimony.

22. The radiation detector production method according to claim 16, wherein
the second metal is one of gold and platinum.

23. The radiation detector production method according to claim 16, further comprising
an intermediate layer forming process for forming an intermediate layer being conductive, after the first layer forming process and before the second layer forming process, the intermediate layer enhancing adhesive force between the first layer and the second layer.

24. The radiation detector production method according to claim 23, wherein
the intermediate layer contains one of chromium, nickel, and titanium.

25. The radiation detector production method according to claim 16, further comprising
an under layer forming process for forming a conductive under layer provided between the corresponding electrode formation surface and the first layer, before the first layer forming process, the conductive under layer enhancing adhesive force between the corresponding electrode formation surface and the first layer.

26. The radiation detector production method according to claim 25, wherein
the conductive under layer contains one of chromium, nickel, and titanium.

* * * * *